(12) United States Patent
Kunitake et al.

(10) Patent No.: US 12,225,705 B2
(45) Date of Patent: Feb. 11, 2025

(54) MEMORY DEVICE HAVING ERROR DETECTION FUNCTION, SEMICONDUCTOR DEVICE, AND ELECTRONIC DEVICE

(71) Applicant: Semiconductor Energy Laboratory Co., Ltd., Atsugi (JP)

(72) Inventors: Hitoshi Kunitake, Isehara (JP); Tatsuya Onuki, Atsugi (JP); Tomoaki Atsumi, Hadano (JP); Kiyoshi Kato, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 635 days.

(21) Appl. No.: 17/419,745

(22) PCT Filed: Feb. 11, 2020

(86) PCT No.: PCT/IB2020/051043
§ 371 (c)(1),
(2) Date: Jun. 30, 2021

(87) PCT Pub. No.: WO2020/170069
PCT Pub. Date: Aug. 27, 2020

(65) Prior Publication Data
US 2022/0085019 A1    Mar. 17, 2022

(30) Foreign Application Priority Data
Feb. 22, 2019    (JP) .................................. 2019-030525

(51) Int. Cl.
*H01L 29/78*    (2006.01)
*G11C 29/52*    (2006.01)
(Continued)

(52) U.S. Cl.
CPC ............. *H10B 12/00* (2023.02); *G11C 29/52* (2013.01); *H01L 29/7869* (2013.01)

(58) Field of Classification Search
CPC ........ H10B 12/00; H10B 99/00; H10B 41/70; G11C 29/52; G11C 11/4097;
(Continued)

(56) References Cited

U.S. PATENT DOCUMENTS 5,561,623 A    10/1996  Ema
6,569,717 B1    5/2003  Murade
(Continued)

FOREIGN PATENT DOCUMENTS

JP    2007-140948 A    6/2007
JP    2008-299922 A    12/2008
(Continued)

OTHER PUBLICATIONS

International Search Report (Application No. PCT/IB2020/051043) Dated Apr. 14, 2020.
(Continued)

*Primary Examiner* — Mohammed Shamsuzzaman
(74) *Attorney, Agent, or Firm* — Eric J. Robinson; Robinson Intellectual Property Law Office, P.C.

(57) ABSTRACT

A memory device having an error detection function and being capable of storing a large amount of data per unit area is provided. A driver circuit of the memory device is formed using a transistor formed on a semiconductor substrate, and a memory cell of the memory device is formed using a thin film transistor. A plurality of layers each of which includes a memory cell using the thin film transistor can be stacked over the semiconductor substrate, so that the amount of data that can be stored per unit area can be increased. Part of a peripheral circuit including the memory device can be formed using a thin film transistor, and thus, an error (Continued)

detection circuit is formed using the thin film transistor and stacked over the semiconductor substrate.

3 Claims, 22 Drawing Sheets

(51) Int. Cl.
*H01L 29/786* (2006.01)
*H10B 12/00* (2023.01)

(58) Field of Classification Search
CPC .... G11C 2029/0403; G11C 2029/0411; G11C 5/025; G11C 29/12015; H01L 29/7869; H01L 27/0688; G06F 11/1004
See application file for complete search history.

(56) References Cited

U.S. PATENT DOCUMENTS

| | | | |
|---|---|---|---|
| 6,643,159 B2 | 11/2003 | Fricke et al. | |
| 7,855,931 B2 | 12/2010 | Laberge et al. | |
| 7,894,293 B2 | 2/2011 | Ikeda et al. | |
| 7,978,721 B2 | 7/2011 | Jeddeloh et al. | |
| 8,010,866 B2 | 8/2011 | Laberge et al. | |
| 8,078,938 B2 | 12/2011 | Kawabata | |
| 8,289,760 B2 | 10/2012 | Jeddeloh | |
| 8,508,967 B2 | 8/2013 | Yamazaki et al. | |
| 8,533,416 B2 | 9/2013 | Laberge et al. | |
| 8,756,486 B2 | 6/2014 | Laberge et al. | |
| 8,779,798 B2 | 7/2014 | Kato | |
| 8,793,460 B2 | 7/2014 | Laberge et al. | |
| 8,806,131 B2 | 8/2014 | Jeddeloh et al. | |
| 9,007,812 B2 | 4/2015 | Koyama et al. | |
| 9,146,811 B2 | 9/2015 | Laberge et al. | |
| 9,275,698 B2 | 3/2016 | Laberge et al. | |
| 9,362,007 B2* | 6/2016 | Hirano | G11C 29/702 |
| 9,424,953 B2* | 8/2016 | Hirano | G11C 29/702 |
| 9,514,792 B2 | 12/2016 | Kajigaya | |
| 9,524,254 B2 | 12/2016 | Jeddeloh et al. | |
| 9,653,611 B2 | 5/2017 | Atsumi et al. | |
| 9,659,630 B2 | 5/2017 | Jeddeloh | |
| 9,852,023 B2 | 12/2017 | Tsutsui | |
| 10,002,676 B2* | 6/2018 | Park | G11C 29/40 |
| 10,097,207 B2* | 10/2018 | Hatsuda | H03M 13/1545 |
| 10,109,343 B2 | 10/2018 | Jeddeloh | |
| 10,361,722 B2* | 7/2019 | Lee | H03M 13/1108 |
| 10,892,003 B2 | 1/2021 | Jeddeloh | |
| 10,936,410 B2 | 3/2021 | Tsutsui | |
| 11,362,685 B2* | 6/2022 | Hirano | H03M 13/6566 |
| 2012/0063208 A1 | 3/2012 | Koyama et al. | |
| 2012/0120715 A1 | 5/2012 | Saito | |
| 2013/0044538 A1* | 2/2013 | Oh | H10B 20/60 365/158 |
| 2013/0070506 A1 | 3/2013 | Kajigaya | |
| 2014/0169092 A1* | 6/2014 | Miyamoto | G06F 11/1048 365/185.05 |
| 2015/0076495 A1 | 3/2015 | Miyairi | |
| 2015/0262642 A1 | 9/2015 | Koyama | |
| 2015/0294710 A1 | 10/2015 | Onuki | |
| 2015/0325282 A1 | 11/2015 | Kato et al. | |
| 2016/0172021 A1* | 6/2016 | Ishizu | G11C 11/4096 365/63 |
| 2016/0253236 A1 | 9/2016 | Tsutsui | |
| 2016/0293232 A1 | 10/2016 | Ishizu et al. | |
| 2016/0336055 A1* | 11/2016 | Kato | H10B 12/315 |
| 2016/0336059 A1 | 11/2016 | Matsuzaki | |
| 2016/0350182 A1* | 12/2016 | Tsutsui | G11C 11/408 |
| 2017/0148514 A1* | 5/2017 | Lee | G11C 13/0002 |
| 2018/0090616 A1* | 3/2018 | Nakagawa | H10K 19/00 |
| 2022/0085073 A1 | 3/2022 | Onuki et al. | |

FOREIGN PATENT DOCUMENTS

| | | | |
|---|---|---|---|
| JP | 2011-527041 | 10/2011 | |
| JP | 2013-065638 A | 4/2013 | |
| JP | 2015053096 A * | 3/2015 | .......... G06F 11/1028 |
| JP | 2016-164780 A | 9/2016 | |
| JP | 2016-224932 A | 12/2016 | |
| KR | 2013-0019207 A | 2/2013 | |
| KR | 2017-0058690 A | 5/2017 | |
| KR | 2017-0122771 A | 11/2017 | |
| WO | WO-2016/135591 | 9/2016 | |

OTHER PUBLICATIONS

Written Opinion (Application No. PCT/IB2020/051043) Dated Apr. 14, 2020.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7.

* cited by examiner

10A

10A

FIG. 6A
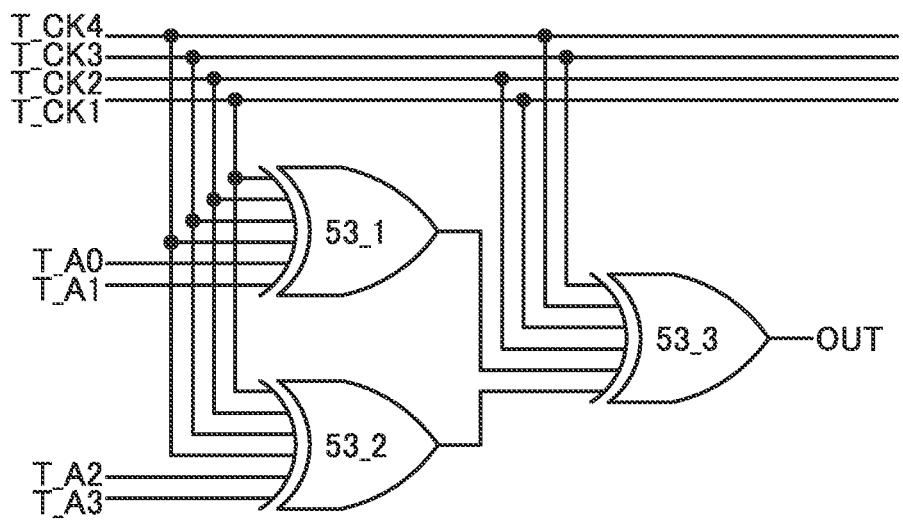
FIG. 6B
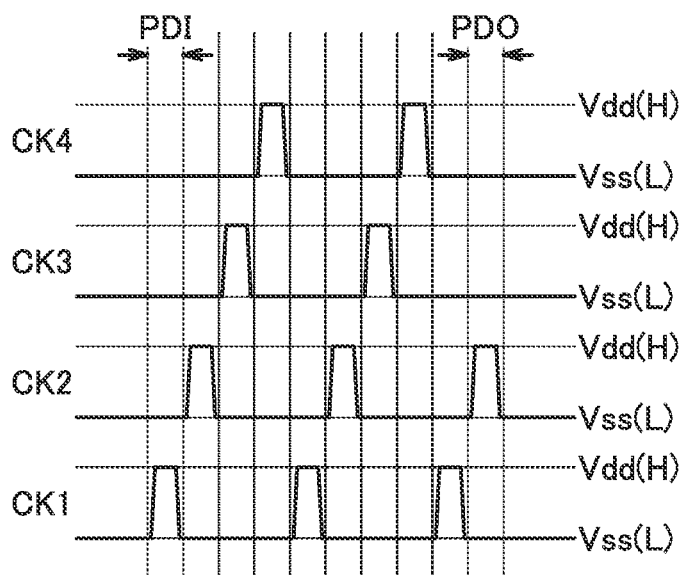
FIG. 6C
| A0 | A1 | A2 | A3 | OUT |
|----|----|----|----|-----|
| L  | L  | L  | L  | L   |
| L  | L  | L  | H  | H   |
| L  | L  | H  | L  | H   |
| L  | L  | H  | H  | L   |
| L  | H  | L  | L  | H   |
| L  | H  | L  | H  | L   |
| L  | H  | H  | L  | L   |
| L  | H  | H  | H  | H   |
| H  | L  | L  | L  | H   |
| H  | L  | L  | H  | L   |
| H  | L  | H  | L  | L   |
| H  | L  | H  | H  | H   |
| H  | H  | L  | L  | L   |
| H  | H  | L  | H  | H   |
| H  | H  | H  | L  | H   |
| H  | H  | H  | H  | L   |

FIG. 8

| B0 | A0 | A1 | A2 | A3 | OUT |
|---|---|---|---|---|---|
| L | L | L | L | L | L |
| L | L | L | L | H | H |
| L | L | L | H | L | H |
| L | L | L | H | H | L |
| L | L | H | L | L | H |
| L | L | H | L | H | L |
| L | L | H | H | L | L |
| L | L | H | H | H | H |
| L | H | L | L | L | H |
| L | H | L | L | H | L |
| L | H | L | H | L | L |
| L | H | L | H | H | H |
| L | H | H | L | L | L |
| L | H | H | L | H | H |
| L | H | H | H | L | H |
| L | H | H | H | H | L |

| B0 | A0 | A1 | A2 | A3 | OUT |
|---|---|---|---|---|---|
| H | L | L | L | L | H |
| H | L | L | L | H | L |
| H | L | L | H | L | L |
| H | L | L | H | H | H |
| H | L | H | L | L | L |
| H | L | H | L | H | H |
| H | L | H | H | L | H |
| H | L | H | H | H | L |
| H | H | L | L | L | L |
| H | H | L | L | H | H |
| H | H | L | H | L | H |
| H | H | L | H | H | L |
| H | H | H | L | L | H |
| H | H | H | L | H | L |
| H | H | H | H | L | L |
| H | H | H | H | H | H |

FIG. 9A
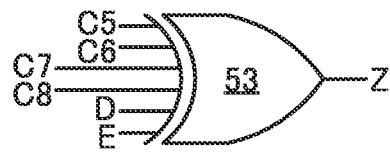
FIG. 9B
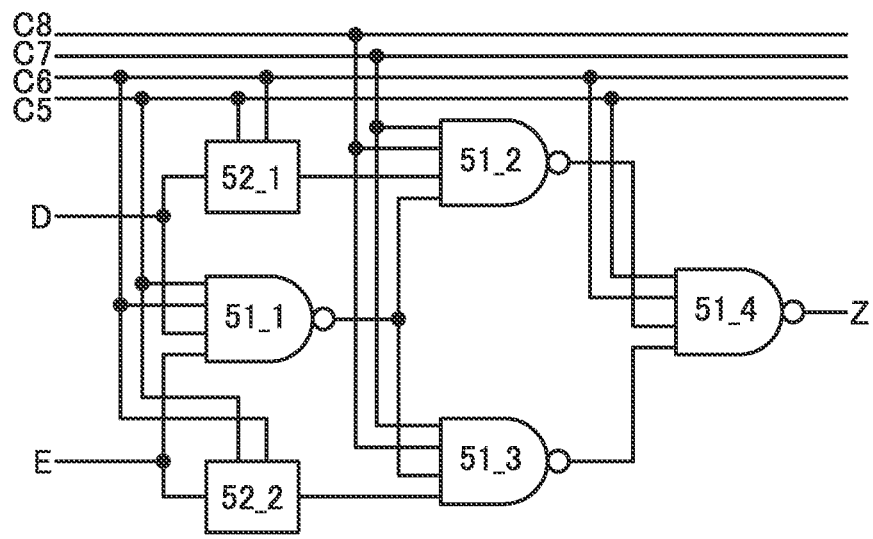
FIG. 9C
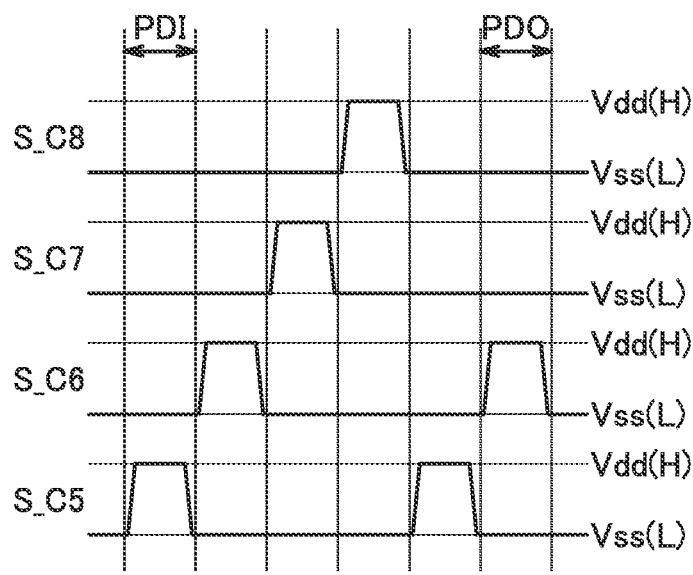
FIG. 9D
| D | E | Z |
|---|---|---|
| L | L | L |
| L | H | H |
| H | L | H |
| H | H | L |

FIG. 10A
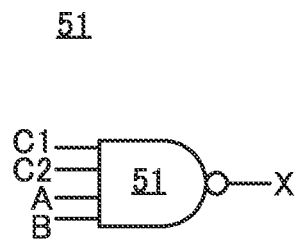
FIG. 10B
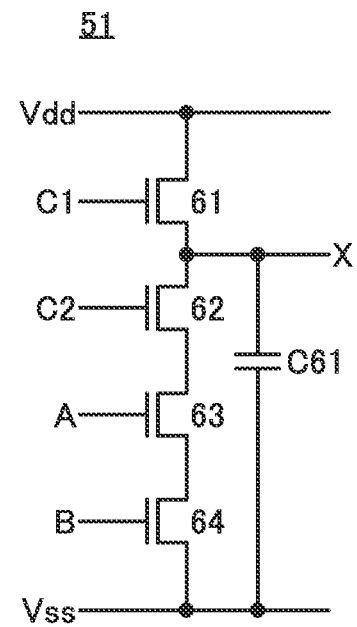
FIG. 10C
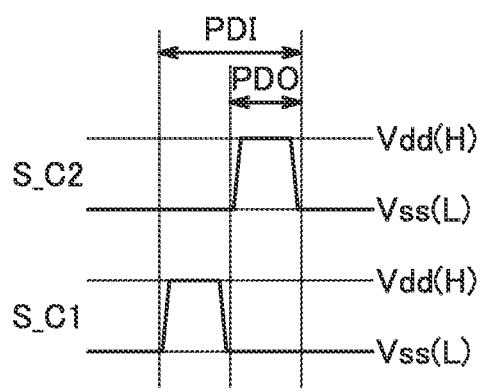
FIG. 10D
| A | B | X |
|---|---|---|
| L | L | H |
| L | H | H |
| H | L | H |
| H | H | L |

FIG. 11A
52
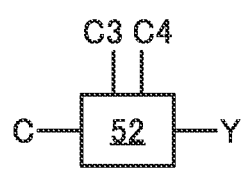
FIG. 11B
52
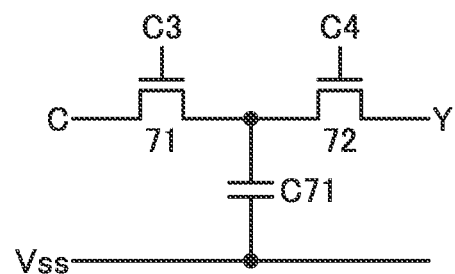
FIG. 11C
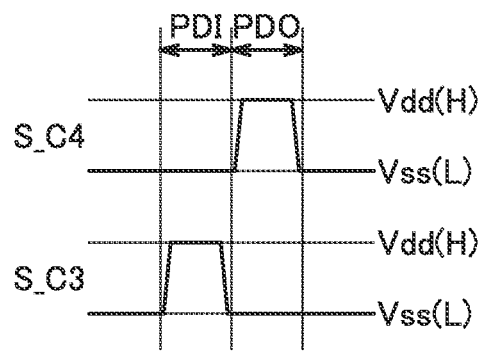
FIG. 11D
| C | Y |
|---|---|
| L | L |
| H | H |

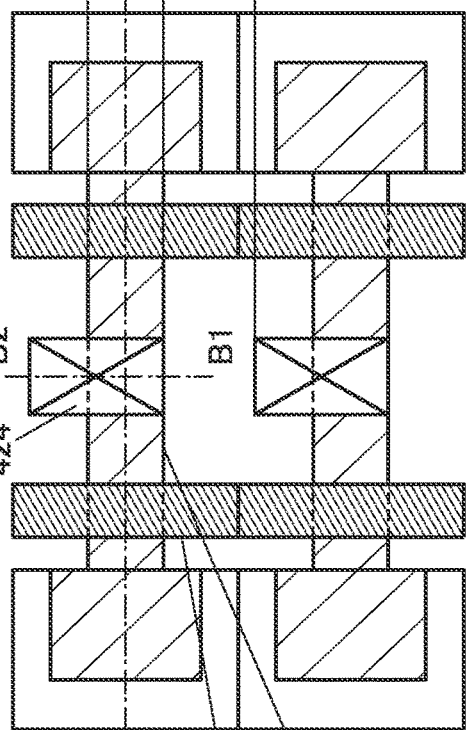
FIG. 18A
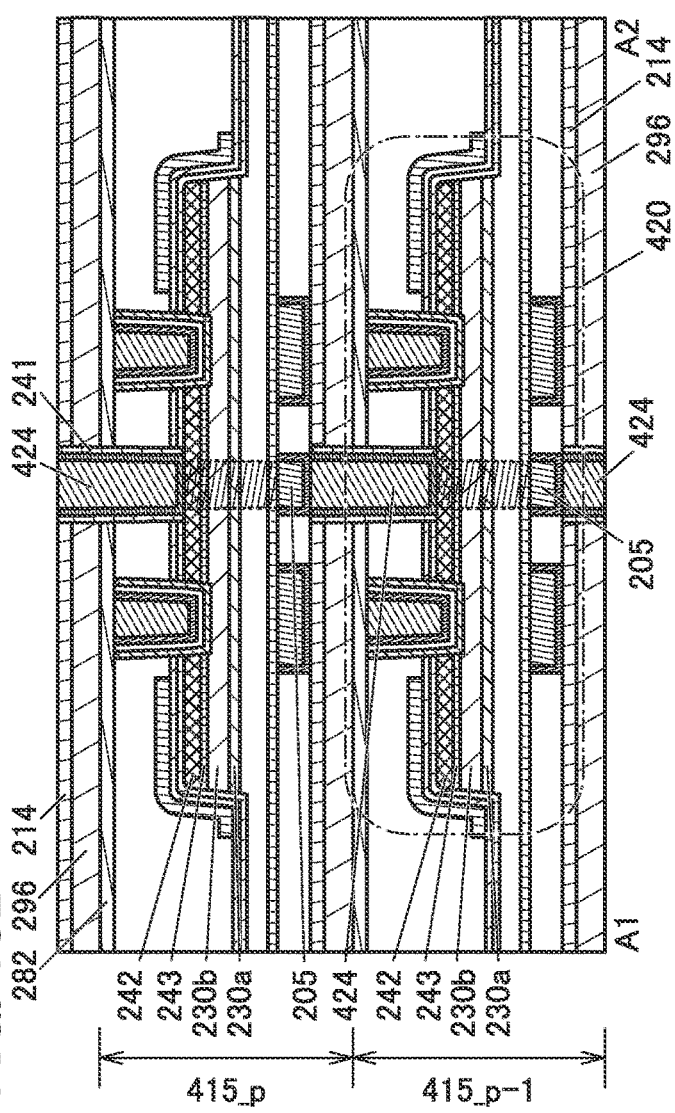
FIG. 18B
FIG. 18C

FIG. 19A
| Amorphous | Crystalline | Crystal |
|---|---|---|
| completely amorphous | •CAAC<br>•nc<br>•CAC | •single crystal<br>•poly crystal |
FIG. 19B
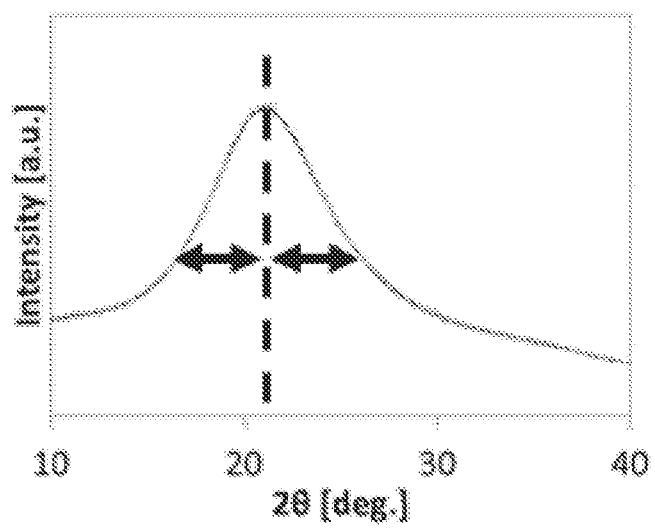
FIG. 19C
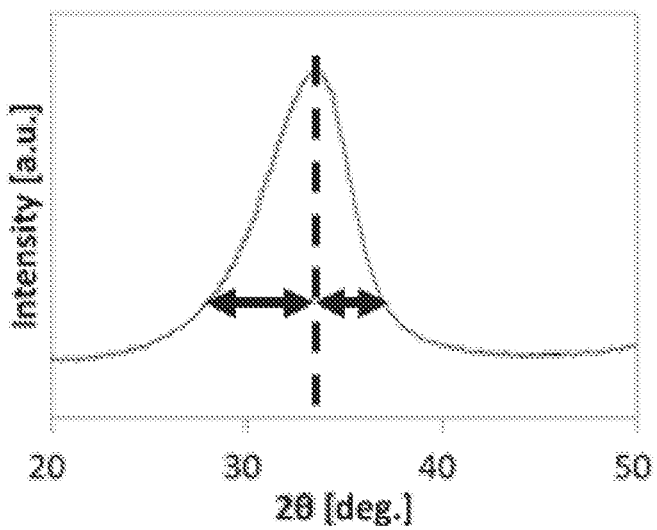

MEMORY DEVICE HAVING ERROR DETECTION FUNCTION, SEMICONDUCTOR DEVICE, AND ELECTRONIC DEVICE

TECHNICAL FIELD

One embodiment of the present invention relates to a memory device. In particular, one embodiment of the present invention relates to a memory device that can function by utilizing semiconductor characteristics.

One embodiment of the present invention relates to a semiconductor device. In this specification and the like, a semiconductor device refers to a device that utilizes semiconductor characteristics and indicates, for example, a circuit including a semiconductor element (a transistor, a diode, a photodiode, and the like), a device including the circuit, and the like. Note that in this specification and the like, a semiconductor device refers to any device that can function by utilizing semiconductor characteristics; examples of the semiconductor device include an integrated circuit, a chip provided with an integrated circuit, an electronic component in which a chip is incorporated in a package, and an electronic device provided with an integrated circuit.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

BACKGROUND ART

A DRAM (Dynamic Random Access Memory) is widely known as a memory device (also referred to as a memory) used in various kinds of electronic devices. The DRAM is a memory device that includes memory cells each being composed of one transistor and one capacitor and stores data by accumulating electric charge in the capacitor.

In the memory device such as a DRAM, an error (mistake) occurs in data stored in the memory cell in some cases due to influence of cosmic rays or the like even when the DRAM itself operates normally. Therefore, a memory device having a function of detecting and correcting errors, which is called an ECC (Error Check and Correct) memory, exists. The ECC memory is used, for example, for an electronic device where occurrence of data error is forbidden, such as a computer used for scientific computation or used in a financial institution.

Meanwhile, a transistor including a metal oxide in a region where a channel of the transistor is formed (also referred to as a channel formation region) (such a transistor is also referred to as oxide semiconductor transistor or OS transistor) has been attracting attention. For example, as a metal oxide applicable to the transistor, an In—Ga—Zn oxide (called IGZO, or the like) is known.

The drain current of the OS transistor in an off state (such a current is also referred to as off-state current) is extremely low (e.g., see Non-Patent Documents 1 and 2); thus, when the OS transistor is used in a memory cell of a DRAM, electric charge accumulated in a capacitor can be retained for a long time.

Moreover, an OS transistor is a thin film transistor and thus can be provided to be stacked. For example, Patent Document 1 discloses such a DRAM structure that a plurality of layers including memory cells formed using OS transistors are stacked over a peripheral circuit formed with a transistor formed using a semiconductor substrate. By stacking a plurality of layers including memory cells of the DRAM, the chip area of the DRAM can be reduced.

In this specification and the like, a DRAM in which an OS transistor is used for a memory cell is referred to as an oxide semiconductor DRAM or a DOSRAM (registered trademark, Dynamic Oxide Semiconductor Random Access Memory).

REFERENCE

Patent Document

[Patent Document 1] United States Patent Application Publication No. 2012/0063208
[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).
[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).

SUMMARY OF THE INVENTION

Problems to be Solved by the Invention

In general, an ECC memory includes a memory region for storing data, a memory region for storing an error detection code or an error correction code (also referred to as redundancy bit or check bit), and a memory controller for controlling the above two memory regions. In addition, when data is stored (i.e., data is written), the ECC memory calculates a check bit corresponding to data to be stored and stores the check bit together with the data to be stored.

The check bit is read out concurrently with reading out stored data. The ECC memory inspects the read-out data with use of the check bit, whereby whether an error has occurred or not in the stored data can be found. When an error has occurred in the stored data, the ECC memory enables the error to be corrected with use of the check bit.

In other words, the ECC memory has to include, in addition to a memory that is not the ECC memory, at least a memory region for storing a check bit and a memory controller for controlling the memory region.

An object of one embodiment of the present invention is to provide a memory device having an error detection function (having a memory region for storing a check bit and a function of determining whether an error has occurred or not in stored data with use of the check bit). Another object of one embodiment of the present invention is to provide a memory device having an error detection function and being capable of storing a large amount of data per unit area.

Note that one embodiment of the present invention does not necessarily achieve all the above objects and only needs to achieve at least one of the objects. The descriptions of the above objects do not preclude the existence of other objects. Objects other than these will be apparent from the descriptions of the specification, the claims, the drawings, and the like, and objects other than these can be derived from the descriptions of the specification, the claims, the drawings, and the like.

Means for Solving the Problems

One embodiment of the present invention is a memory device including a first-element layer including a memory cell, a second-element layer including an error detection circuit, and a semiconductor substrate including a driver circuit. The second-element layer is positioned between the semiconductor substrate and the first-element layer.

One embodiment of the present invention is a memory device including a plurality of first-element layers, a second-element layer including an error detection circuit, and a semiconductor substrate including a driver circuit. The second-element layer is positioned between the semiconductor substrate and the first-element layer. The plurality of first-element layers each include a memory cell, and the plurality of first-element layers are stacked.

In the above mode, a transistor included in the memory cell and a transistor included in the error detection circuit each include a metal oxide in a channel formation region.

In the above mode, a transistor included in the memory cell and a transistor included in the error detection circuit each include a front gate and a back gate.

In the above mode, a transistor included in the memory cell and a transistor included in the error detection circuit each include a metal oxide in a channel formation region, and the transistor included in the memory cell and the transistor included in the error detection circuit each include a front gate and a back gate.

One embodiment of the present invention is a memory device including first to N-th first-element layers (N is a natural number greater than or equal to 2), a second-element layer, and a semiconductor substrate. The K-th (K is an integer greater than or equal to 1 and less than or equal to N) first-element layer includes a memory cell using a transistor formed in the K-th first-element layer. The second-element layer includes an error detection circuit using a transistor formed in the second element layer. The semiconductor substrate includes a driver circuit using a transistor formed in the semiconductor substrate. The second-element layer is stacked over the semiconductor substrate, the first first-element layer is stacked over the second-element layer, and the L-th (L is an integer greater than or equal to 2 and less than or equal to N) first-element layer is stacked over the L−1-th first-element layer.

In the above mode, the transistor formed in the K-th first-element layer and the transistor formed in the second-element layer each include a metal oxide in a channel formation region.

In the above mode, the transistor formed in the K-th first-element layer and the transistor formed in the second-element layer each include a front gate and a back gate.

In the above mode, the transistor formed in the K-th first-element layer and the transistor formed in the second-element layer each include a metal oxide in a channel formation region, and the transistor formed in the K-th first-element layer and the transistor formed in the second-element layer each include a front gate and a back gate.

Effect of the Invention

According to one embodiment of the present invention, a memory device having an error detection function can be provided. Alternatively, according to one embodiment of the present invention, a memory device having an error detection function and enabling a large amount of data to be stored per unit area can be provided.

Note that the description of these effects does not preclude the existence of other effects. One embodiment of the present invention does not necessarily have all the effects. Effects other than these will be apparent from the descriptions of the specification, the claims, the drawings, and the like, and effects other than these can be derived from the descriptions of the specification, the claims, the drawings, and the like.

BRIEF DESCRIPTION OF THE DRAWINGS

FIG. 6A is a circuit diagram illustrating a structure example of a check bit generation circuit. FIG. 6B is a timing chart. FIG. 6C is a truth table.

FIG. 8 is a truth table.

FIG. 9A shows a symbol representing an XOR circuit. FIG. 9B is a circuit diagram illustrating a structure example of the XOR circuit. FIG. 9C is a timing chart. FIG. 9D is a truth table.

FIG. 10A shows a symbol representing a NAND circuit. FIG. 10B is a circuit diagram illustrating a structure example of the NAND circuit. FIG. 10C is a timing chart. FIG. 10D is a truth table.

FIG. 11A shows a symbol indicating a delay circuit. FIG. 11B is a circuit diagram showing a structure example of the delay circuit. FIG. 11C is a timing chart. FIG. 11D is a truth table.

FIG. 18A is a top view illustrating a structure example of a memory device. FIG. 18B and FIG. 18C are a schematic cross-sectional views illustrating a structure example of a memory device.

FIG. 19A shows classification of IGZO crystal structures. FIG. 19B shows an XRD spectrum of quartz glass. FIG. 19C shows an XRD spectrum of crystalline IGZO.

MODE FOR CARRYING OUT THE INVENTION

Figure 1A:
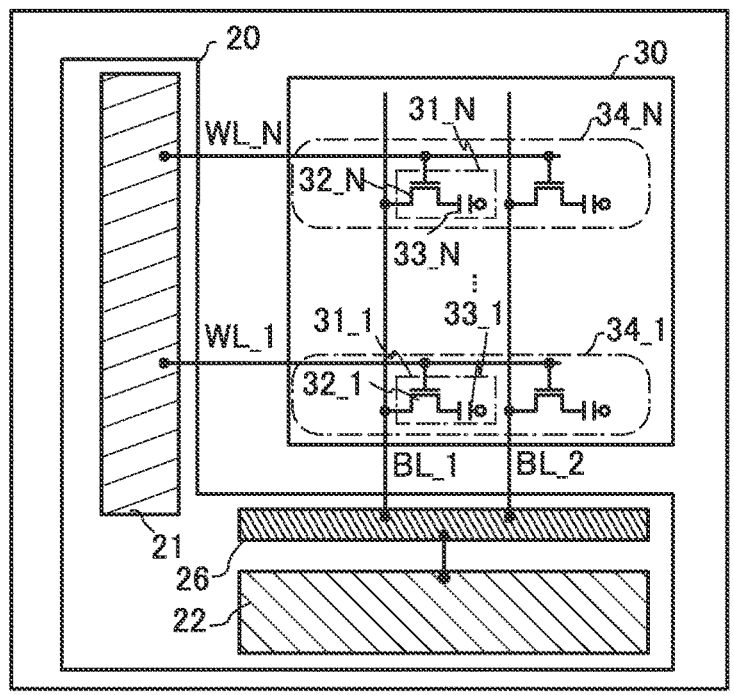
FIG. 1A is a block diagram illustrating a structure example of a memory device.

Hereinafter, embodiments will be described with reference to the drawings. Note that the embodiments can be implemented with various modes, and it will be readily appreciated by those skilled in the art that modes and details thereof can be changed in various ways without departing from the spirit and scope thereof. Thus, the present invention should not be construed as being limited to the following description of the embodiments.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate actual components completely according to their functions, and it is possible for one component to relate to a plurality of functions.

In the drawings and the like, the size, the layer thickness, the region, or the like is exaggerated for clarity in some cases. Therefore, they are not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, ordinal numbers such as "first", "second", and "third" are used in order to avoid confusion among components, and the terms do not limit the components numerically.

In this specification and the like, when a plurality of components are denoted by the same reference signs, and in particular need to be distinguished from each other, an identification numeral such as "_1", "_2", "[n]", or "[m,n]" is sometimes added to the reference signs. For example, the second wiring GL is referred to as a wiring GL[2].

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring. Furthermore, even when the expression "being electrically connected" is used, there is a case in which no physical connection portion is made and a wiring is just extended in an actual circuit.

In addition, in this specification and the like, the term "electrode" or "wiring" does not functionally limit these components. For example, an "electrode" is used as part of a "wiring" in some cases, and vice versa.

In this specification and the like, a "terminal" in an electric circuit refers to a portion where a current or a potential is input (or output) or a signal is received (or transmitted). Accordingly, part of a wiring or an electrode functions as a terminal in some cases.

In general, a "capacitor" has a structure in which two electrodes face each other with an insulator (dielectric) therebetween. This specification and the like include a case where a "capacitor element" is the above-described "capacitor". That is, this specification and the like include cases where a "capacitor element" is one having a structure in which two electrodes face each other with an insulator therebetween, one having a structure in which two wirings face each other with an insulator therebetween, or one in which two wirings are positioned with an insulator therebetween.

In this specification and the like, a "voltage" often refers to a potential difference between a given potential and a reference potential (e.g., a ground potential). Thus, a voltage and a potential difference can be interchanged with each other.

In this specification and the like, a transistor is an element having at least three terminals of a gate, a drain, and a source. In addition, a channel formation region is included between the drain (a drain terminal, a drain region, or a drain electrode) and the source (a source terminal, a source region, or a source electrode), and a current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Thus, the terms of a source and a drain are interchangeable for use in this specification and the like.

Furthermore, unless otherwise specified, an off-state current in this specification and the like refers to a drain current of a transistor in an off state (also referred to as a non-conduction state or a cutoff state). Unless otherwise specified, the off state of an n-channel transistor refers to a state where the gate voltage $V_{gs}$ with respect to a source is lower than a threshold voltage $V_{th}$, and the off state of a p-channel transistor refers to a state where the gate voltage $V_{gs}$ with respect to a source is higher than the threshold voltage $V_{th}$. That is, the off-state current of an n-channel transistor sometimes refers to drain current at the time when the voltage $V_{gs}$ of a gate with respect to a source is lower than the threshold voltage $V_{th}$.

In the above description of the off-state current, the drain may be replaced with the source. That is, the off-state current sometimes refers to a source current when a transistor is in an off state. In addition, a leakage current sometimes expresses the same meaning as the off-state current. Furthermore, in this specification and the like, the off-state current sometimes refers to a current that flows between a source and a drain when a transistor is in an off state.

Furthermore, in this specification and the like, an on-state current sometimes refers to a current that flows between a source and a drain when a transistor is in an on state (also referred to as a conduction state).

In this specification and the like, a metal oxide means an oxide of metal in a broad sense. Metal oxides are classified into an oxide insulator, an oxide conductor (including a transparent oxide conductor), an oxide semiconductor, and the like.

For example, in the case where a metal oxide is used in a channel formation region of a transistor, the metal oxide is referred to as an oxide semiconductor in some cases. That is to say, in the case where a metal oxide has at least one of an amplifying function, a rectifying function, and a switching function, the metal oxide can also be called a metal oxide semiconductor. In other words, a transistor containing a metal oxide in a channel formation region can be referred to as an "oxide semiconductor transistor" or an "OS transistor".

Furthermore, in this specification and the like, a metal oxide containing nitrogen is also referred to as a metal oxide in some cases. A metal oxide containing nitrogen may be referred to as a metal oxynitride. The details of a metal oxide will be described later.

Embodiment 1

Structure examples of memory devices of one embodiment of the present invention will be described with reference to FIG. 1 to FIG. 11. The memory devices of one embodiment of the present invention are each a memory device that can function by utilizing semiconductor characteristics, and is also called a memory.

The memory devices of one embodiment of the present invention each have a structure in which a plurality of layers including OS transistors are stacked over a layer including a transistor formed using a semiconductor substrate. The OS transistor has a characteristic of an extremely low off-state current.

<Block Diagram of Memory Device>

FIG. 1A is a block diagram illustrating a structure example of a memory device 10A that is one embodiment of the present invention. Note that in the drawings described in this specification and the like, the flow of main signals is indicated by an arrow or a line, and a power supply line and the like are omitted in some cases.

The memory device 10A includes a peripheral circuit 20 and a memory cell array 30. The peripheral circuit 20 includes, in addition to a row driver 21 and a column driver 22, an element layer 26 including a precharge circuit 24, a sense amplifier 25, a check bit generation circuit 54, an error detection circuit 55, and a switch circuit 23 (see FIG. 3).

The row driver 21 has a function of outputting a signal for driving the memory cell array 30 to a word line WL. Specifically, the row driver 21 has a function of outputting a word signal to the word line WL (WL_1 and WL_N are illustrated in FIG. 1A, and N is a natural number greater than or equal to 2). The row driver 21 is referred to as a word line driver circuit in some cases. Note that the row driver 21 includes a decoder circuit for selecting the word line WL corresponding to the specified address, a buffer circuit, or the like. The word line WL is simply referred to as a wiring in some cases.

The column driver 22 has a function of outputting a signal for driving the memory cell array 30 to a bit line BL. Specifically, the column driver 22 has a function of outputting a data signal to the bit line BL (BL_1 and BL_2 are illustrated in FIG. 1A). The column driver 22 is referred to as a bit line driver circuit in some cases. Note that the column driver 22 includes a decoder circuit for selecting a bit line corresponding to a specified address, or the like. The bit line BL is simply referred to as a wiring in some cases.

In the drawings, the bit line BL is represented by a bold line or a bold dotted line in some cases for increasing visibility.

The data signal supplied to the bit line BL corresponds to a signal written to a memory cell or a signal read out from the memory cell. The data signal is described as a binary signal having a high-level or a low-level potential corresponding to data 1 or data 0 (also referred to as data High or data Low, or data H or data L). The high-level potential is a potential VDD, and the low-level potential is a potential VSS or a ground potential (GND). Note that a level of the data signal may be multilevel higher than or equal to ternary.

Other signals supplied to the bit line BL include a precharge potential for reading out data. The precharge potential can be VDD/2, for example.

The memory cell array 30 includes, for example, N (N is a natural number greater than or equal to 2) element layers 34_1 to 34_N. The element layer 34_1 includes one or more memory cells 31_1. The memory cell 31_1 includes a transistor 32_1 and a capacitor 33_1. The element layer 34_N includes one or more memory cells 31_N. The memory cell 31_N includes a transistor 32_N and a capacitor 33_N.

Note that the capacitor is referred to as a capacitor element in some cases. The element layer indicates a layer in which elements such as a capacitor and a transistor are provided and a layer including components such as a conductor, a semiconductor, and an insulator.

The transistors 32_1 to 32_N function as switches whose conduction states (also referred to as on or on state) and non-conduction states (also referred to as off or off state) are controlled in accordance with word signals supplied to the word lines WL_1 to WL_N. In addition, one of a source and a drain of each of the transistors 32_1 to 32_N is connected to any one of the bit lines BL.

Each of the transistors 32_1 to 32_N is preferably a transistor including a metal oxide in a channel formation region (hereinafter referred to as OS transistor). In the structure of one embodiment of the present invention, an OS transistor is used in the memory cell, so that electric charge corresponding to a predetermined potential can be retained in the capacitors 33_1 to 33_N which are electrically connected to the other of the sources and the drains of the transistors 32_1 to 32_N with use of a characteristic of extremely low leakage current flowing between the source and the drain when the transistor is in an off state (the leakage current is hereinafter referred to as off-state current).

In other words, data once written to the memory cells 31_1 to 31_N can be retained for a long time. Thus, the memory device 10A enables the frequency of data refresh to be reduced, and low power consumption can be achieved.

In addition, the memory cells 31_1 to 31_N each using an OS transistor can rewrite and read data by charging or discharging of electric charge; thus, a substantially unlimited number of times of data writing and data reading is possible.

Unlike a magnetic memory or a resistive random-access memory, the memory cells 31_1 to 31_N each using an OS transistor do not undergo an atomic-level structure change and thus are superior in rewrite endurance. In addition, unlike a flash memory, the memory cells 31_1 to 31_N each using an OS transistor do not exhibit instability in characteristics due to an increase in electron trap centers caused by repeated rewrite operations.

The memory cells 31_1 to 31_N each using an OS transistor can be provided over a silicon substrate provided with a transistor including silicon in its channel formation region (hereinafter referred to as Si transistor) or the like. Thus, integration can be facilitated. Furthermore, an OS transistor can be manufactured with a manufacturing apparatus similar to that for a Si transistor and thus can be manufactured at low cost.

An OS transistor can be a four-terminal semiconductor element including a back gate electrode in addition to a gate electrode, a source electrode, and a drain electrode. The OS transistor can be formed with an electric circuit network that can independently control input and output of signals flowing between a source and a drain depending on a potential supplied to the gate electrode or the back gate electrode. Therefore, the circuit design can be made on the same concept as that for LSI (Large Scale Integration).

Furthermore, electrical characteristics of the OS transistor are better than those of a Si transistor in a high-temperature environment. Specifically, the ratio between an on-state current and an off-state current is large even at a high temperature higher than or equal to 125° C. and lower than or equal to 150° C.; thus, favorable switching operation can be performed.

Note that the memory device 10A illustrated in FIG. 1A can be referred to as a DOSRAM (Dynamic Oxide Semiconductor Random Access Memory) using an OS transistor in a memory cell. Since one memory cell can be composed of one transistor and one capacitor, a high-density memory that can store a large amount of data can be achieved. In addition, using an OS transistor enables data retention time to be prolonged.

The capacitors 33_1 to 33_N each have a structure in which an insulator is sandwiched between conductors to be electrodes. Note that as a conductor included in the electrode, a semiconductor to which a conductivity is imparted, or the like can be used. Although the details of the arrangement of the capacitors 33_1 to 33_N are described later, the following arrangement is possible: the capacitors 33_1 to 33_N are positioned over or below the transistors 32_1 to 32_N to overlap with the transistors 32_1 to 32_N; or parts of semiconductor layers, electrodes, or the like included in the transistors 32_1 to 32_N are used as one of electrodes of the capacitors 33_1 to 33_N.

The element layer 26 including the precharge circuit 24, the sense amplifier 25, the check bit generation circuit 54, the error detection circuit 55, and the switch circuit 23 has a function of generating a check bit when data is written to the memory cell, a function of precharging the bit line BL when data is read out from the memory cell, a function of amplifying a potential of the bit line BL, and a function of detecting whether or not the data read out from the memory cell has an error occurs with use of the check bit.

Each of the circuits (the precharge circuit 24, the sense amplifier 25, the check bit generation circuit 54, the error detection circuit 55, and the switch circuit 23) included in the element layer 26 is preferably formed using an OS transistor. When each circuit included in the element layer 26 is formed using an OS transistor, the element layer 26 can be provided over a silicon substrate or the like where a Si transistor is formed. Thus, the integration can be facilitated. Furthermore, the OS transistor can be manufactured with a manufacturing apparatus similar to that for a Si transistor and thus can be manufactured at low cost.

<Schematic Diagram of Memory Device>

Figure 1B:
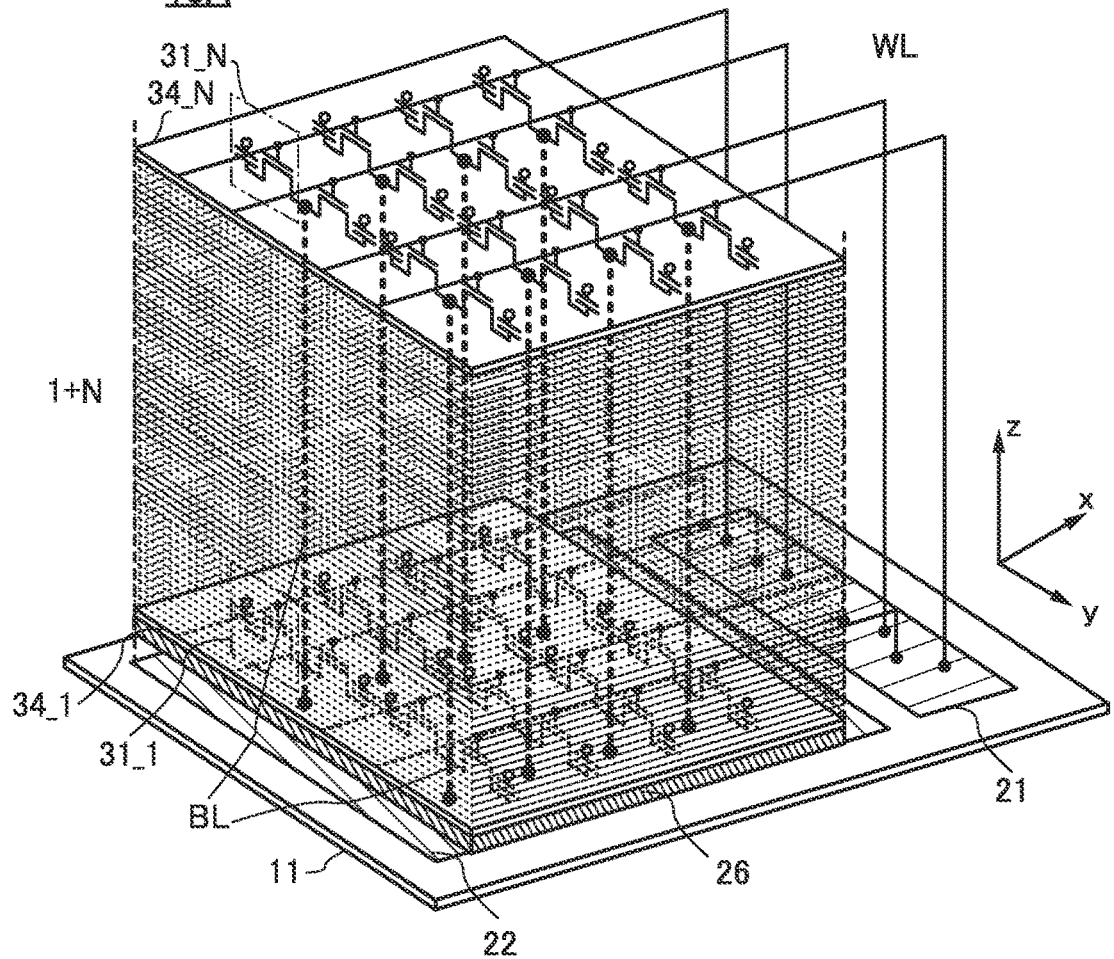
FIG. 1B is a schematic diagram illustrating the structure example of the memory device.

FIG. 1B is a schematic diagram illustrating a structure example of the memory device 10A for describing the element layers 34_1 to 34_N and the element layer 26 as the structures described with reference to FIG. 1A. The schematic diagram in FIG. 1B is a perspective view in which directions of an x-axis, a y-axis, and a z-axis are defined for describing the arrangement of each structure described in FIG. 1A.

As illustrated in FIG. 1B, the element layer 26 and the element layer 34_1 to the element layer 34_N, that is, (1+N) layers in total each including an OS transistor, are stacked over a semiconductor substrate 11 in the memory device 10A. Each of the element layer 26 and the memory cells 31_1 to 31_N included in the element layer 34_1 to the element layer 34_N has a region overlapping with the column driver 22 formed using the semiconductor substrate 11. The element layer 26 is provided between the semiconductor substrate 11 and the element layer 34_1.

There is no particular limitation on the semiconductor substrate 11 as long as a channel region of a transistor can be formed therein. For example, a single crystal silicon substrate, a single crystal germanium substrate, a compound semiconductor substrate (such as a SiC substrate or a GaN substrate), an SOI (Silicon on Insulator) substrate, or the like can be used.

The transistor in the memory cell 31_1 included in the element layer 34_1 and the transistor in the memory cell 31_N included in the element layer 34_N are electrically connected via the bit line BL provided in the vertical direction. The bit line BL is electrically connected to the element layer 26, and the element layer 26 is electrically connected to the column driver 22 formed using the semiconductor substrate 11.

For example, a bit line BL_1 is provided in contact with a semiconductor layer of the transistor included in the memory cell 31_1. Alternatively, the bit line BL_1 is provided in contact with a region functioning as a source or a drain in the semiconductor layer of the transistor included in the memory cell 31_1. Alternatively, the bit line BL_1 is provided in contact with a conductor provided in contact with the region functioning as the source or the drain in the semiconductor layer of the transistor included in the memory cell 31_1.

In other words, the bit line BL can be regarded as a wiring that electrically connects one of the source and the drain of the transistor included in the memory cell 31_1, one of the source and the drain of the transistor included in the memory cell 31_N, and the element layer 26.

The bit line BL can be regarded to be provided to extend in the direction vertical to or substantially vertical to a plane of the semiconductor substrate 11 where the column driver 22 is provided. In other words, as illustrated in FIG. 1B, the bit line BL is provided to be connected to the transistor included in the memory cell 31_1 and the transistor included in the memory cell 31_N and to be in the direction vertical (z direction) or substantially vertical to the surface (xy plane) of the semiconductor substrate. Note that the term "substantially vertical" means a state where the angle is greater than or equal to 85° and less than or equal to 95°.

In the memory device 10A that is one embodiment of the present invention, an OS transistor with an extremely low off-state current is used as the transistor provided in each element layer. Accordingly, the frequency of refreshing data retained in the memory cell can be reduced, and power consumption of the memory device can be reduced.

OS transistors can be stacked and manufactured in the vertical direction using the same manufacturing process repeatedly; thus, the manufacturing cost can be reduced. In addition, in the memory device 10A, the transistors included in the memory cells can be arranged not in the plane direction but in the vertical direction, so that the memory density can be improved. Consequently, the memory device 10A can be downsized.

In addition, the OS transistor has a smaller fluctuation in electrical characteristics than a Si transistor even in a high-temperature environment; when the OS transistors are stacked and integrated, a fluctuation in electric characteristics of the transistors is small. Thus, the memory device 10A can function as a memory device with high reliability.

Since the memory cells can be arranged over the column driver and the like in the memory device 10A, the memory device 10A can be a small-sized high-density memory device that can store a large amount of data. Furthermore, the memory device 10A can operate even when capacitance of the capacitors in the memory cells is reduced.

In the memory device 10A, the bit line extended from the memory cell array is provided in the direction substantially vertical to the surface of the semiconductor substrate 11, whereby the length of the bit line between the memory cell array and the element layer 26 can be reduced. Thus, parasitic capacitance of the bit line can be reduced, and a potential of a data signal retained in the memory cell can be read out even when the data signal is a multilevel signal.

<Cross-Sectional View of Memory Device>

Figure 2:
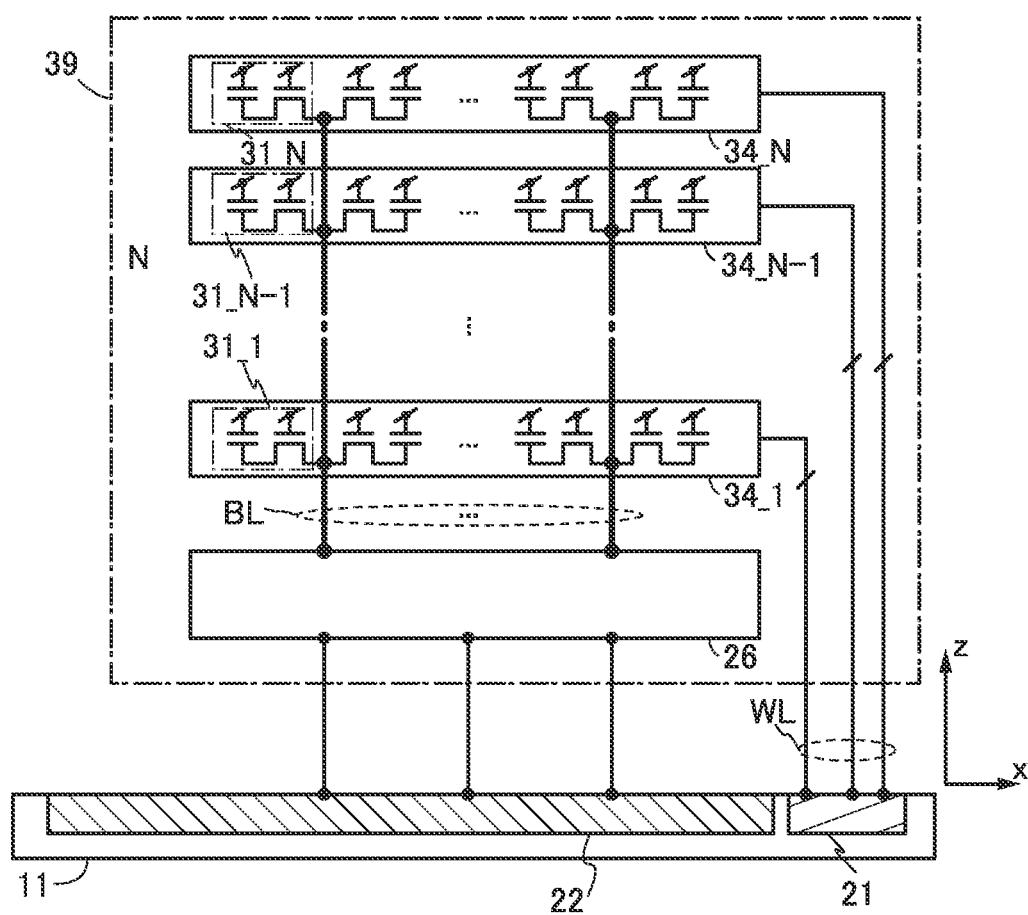
FIG. 2 is a schematic diagram illustrating a structure example of a memory device.

FIG. 2 shows a schematic view of a cross section parallel to the vertical direction (z-axis direction) of the memory device 10A described with reference to FIG. 1A and FIG. 1B.

As illustrated in FIG. 2, in the memory device 10A, the memory cells 31_1 to 31_N provided in the element layers, the element layer 26, and the column driver 22 formed using the semiconductor substrate 11 can be connected via the bit line BL provided in the vertical direction. When the bit line BL is provided in the vertical direction, the length of the bit line BL can be reduced, so that the load of the bit line BL can be reduced.

Figure 3:
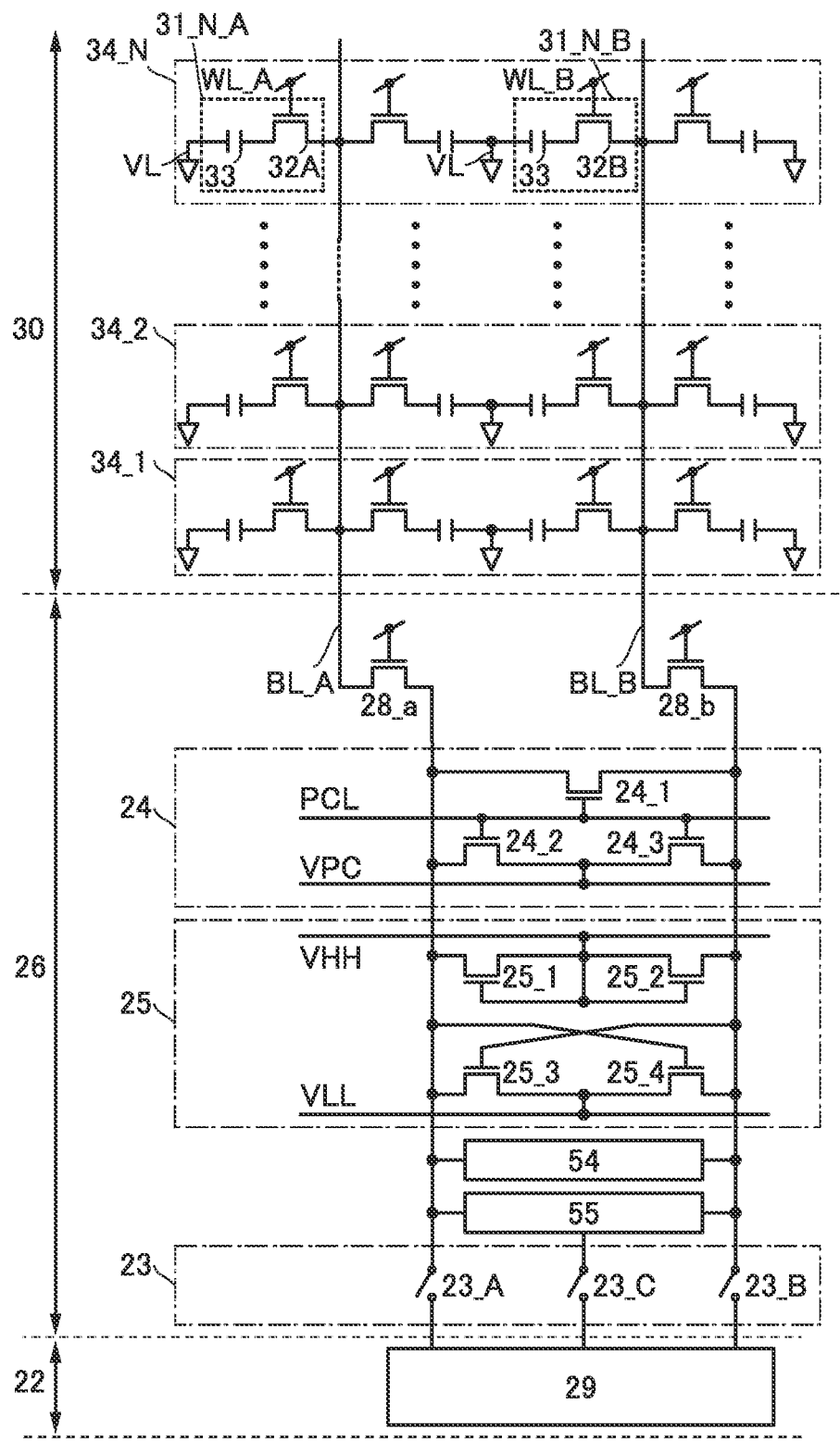
FIG. 3 is a circuit diagram illustrating a structure example of a memory device.

FIG. 3 illustrates the element layers 34_1 to 34_N as the memory cell array 30, the element layer 26 including the precharge circuit 24, the sense amplifier 25, the check bit generation circuit 54, the error detection circuit 55, and the switch circuit 23, and a write/read circuit 29 included in the column driver 22.

FIG. 3 also illustrates a bit line BL_A or BL_B, transistors 28_a and 28_b controlling conduction of the precharge circuit 24 and the sense amplifier 25, and a switch 23_A to a switch 23_C in the switch circuit 23. The bit line BLA is connected to one of a source and a drain of the transistor 28_a, and the bit line BLB is connected to one of a source and a drain of the transistor 28_b.

Over the element layer 26 illustrated in FIG. 3, the element layer 34_1 to 34_N are provided, and the bit line BL_A and the bit line BL_B are provided in the vertical direction. In other words, the element layer 26 constituting part of the peripheral circuit can be stacked in a manner similar to the arrangement of the element layers 34_1 to 34_N. The bit line BL_A and the bit line BL_B are connected to the transistors included in the precharge circuit 24 and the sense amplifier 25 via the transistor 28_a and the transistor 28_b.

The precharge circuit 24 includes n-channel transistors 24_1 to 24_3. The precharge circuit 24 is a circuit for precharging the bit line BL_A and the bit line BL_B to have an intermediate potential VPC corresponding to a potential VDD/2 that is between the potential VDD and the potential VSS, for example, in accordance with a precharge signal supplied to a precharge line PCL.

The sense amplifier 25 includes n-channel transistors 25_1 to 25_4. The transistor 25_1 and the transistor 25_2 are connected to a wiring VHH, and the transistor 25_3 and the transistor 25_4 are connected to a wiring VLL. The wiring VHH has a function of suppling a potential VDD, and the wiring VLL has a function of supplying a potential VSS. The transistors 25_1 to 25_4 are transistors forming an inverter loop.

When the data is read out from the memory cell, the precharge circuit 24 precharges the bit line, and the row driver 21 sets the word line of the selected memory cell to a high level, whereby the potential of the precharged bit line is changed. Depending on the change, the sense amplifier 25 sets the potentials of a pair of wirings connected to the sense amplifier 25 to the potential VDD or the potential VSS and outputs the potentials to the write/read circuit 29 through the switch circuit 23.

The check bit generation circuit 54 has a function of generating a check bit based on a data signal output from the write/read circuit 29 when data is written to the memory cell. The error detection circuit 55 has a function of detecting whether data read out from the memory cell has an error or not with use of the check bit when the data is read out from the memory cell and a function of outputting the detection result to the write/read circuit 29. Details of the check bit generation circuit 54 and the error detection circuit 55 are described later.

Figure 4:
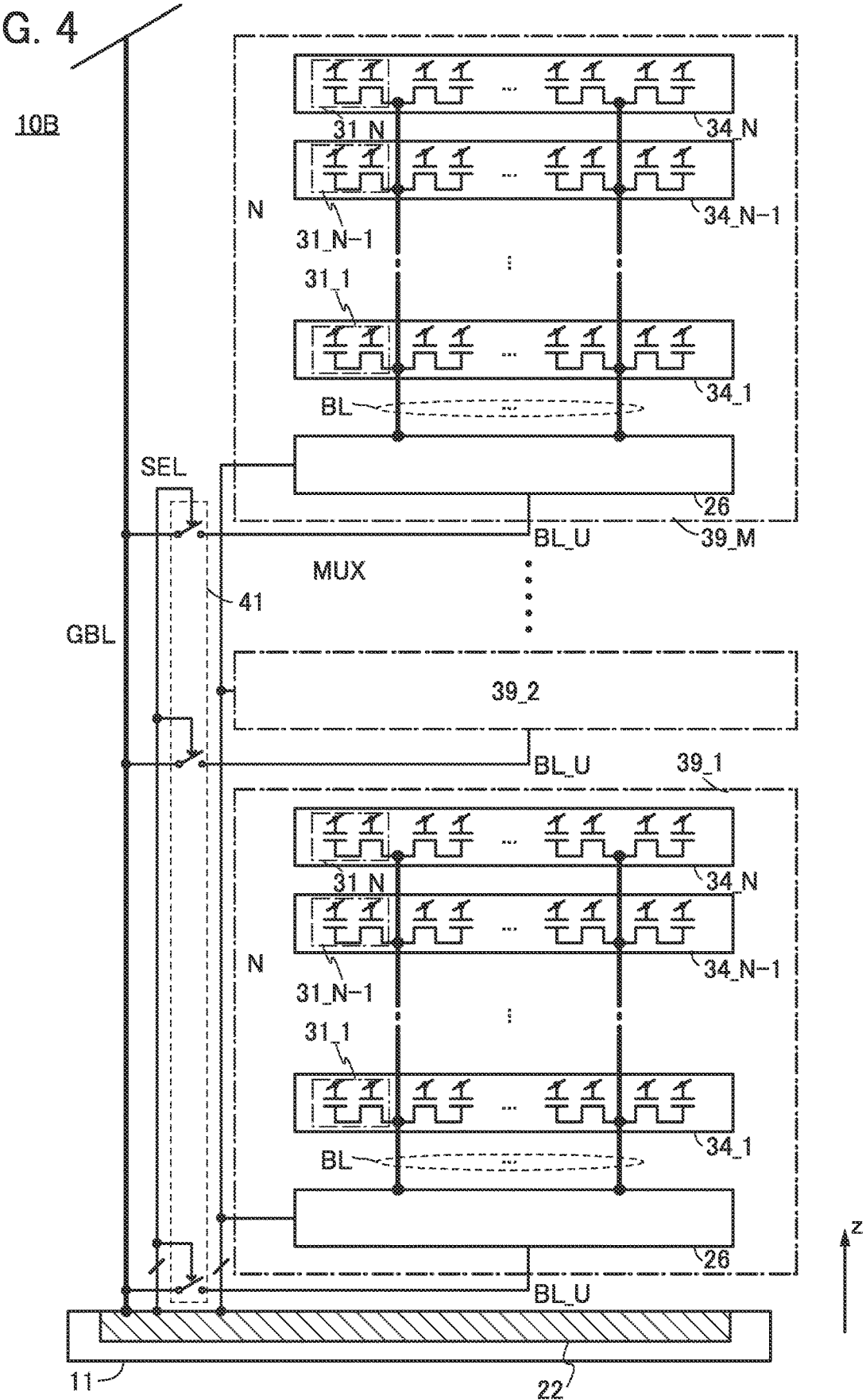
FIG. 4 is a schematic diagram illustrating a structure example of a memory device.
Figure 5A:
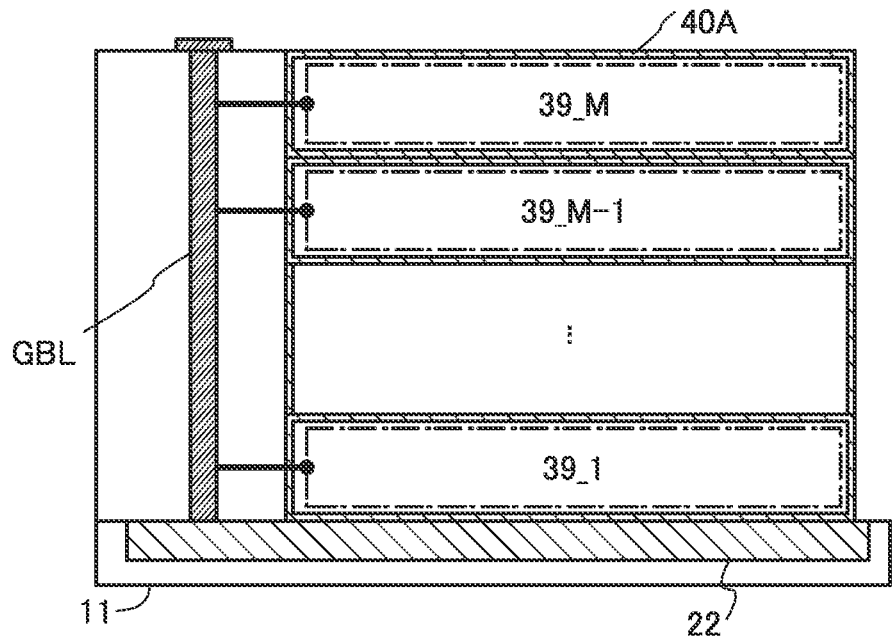
FIG. 5A and FIG. 5B are schematic diagrams illustrating structure examples of memory devices.
Figure 5B:
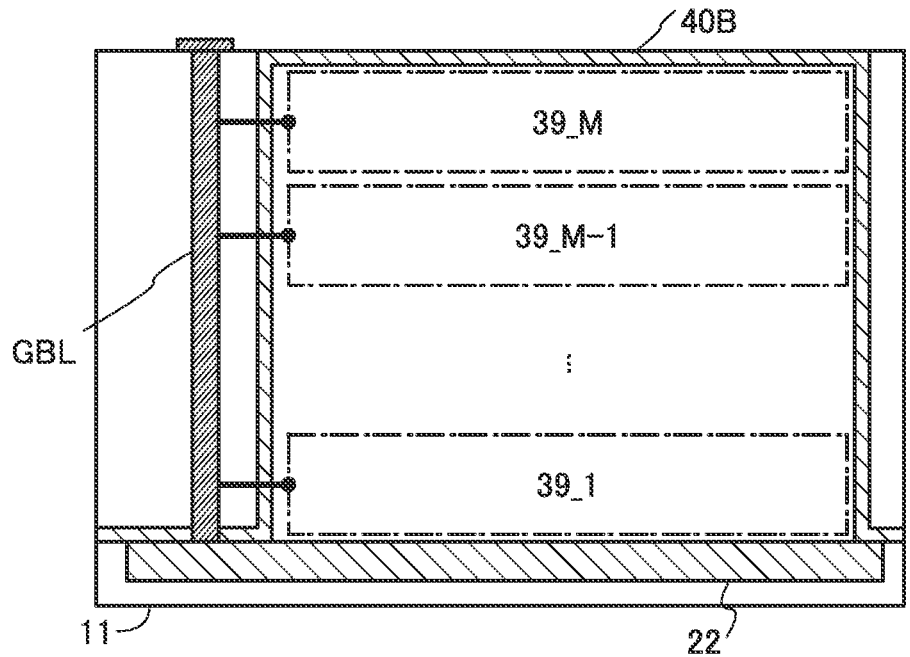

Note that in the case where the element layers 34_1 to 34_N and the element layer 26 in the memory device 10A illustrated in FIG. 2 are collectively referred to as a unit 39, the unit 39 may be stacked in the vertical direction. FIG. 4 illustrates a memory device 10B in which M units 39 (a unit 39_1 to a unit 39_M; M is a natural number greater than or equal to 2) are stacked with use of the unit 39 described with reference to FIG. 2. FIG. 4 shows a schematic view of a cross section parallel to the vertical direction (z-axis direction) of the memory device 10B.

As illustrated in FIG. 4, in the memory device 10B, each of the unit 39_1 to the unit 39_M includes the element layers 34_1 to 34_N and the element layer 26. One of the unit 39_1 to the unit 39_M is selected by a selection signal MUX, and the selected unit 39 inputs or outputs a signal through a wiring BL_U and the element layer 26. The wiring BL_U is selected by a switch circuit 41 that can be switched by a selection signal SEL and is connected to the column driver 22 through the wiring GBL. Note that the switch circuit 41 may be formed using the OS transistor included in the element layer 26.

With the structure of the memory device 10B, the number of stacked element layers 34_1 to 34_N in each of the unit 391 to the unit 39_M can be reduced. When the number of stacked element layers 34_1 to 34_N is reduced, the length of the bit line BL can be reduced, and accordingly the load on the bit line BL can be reduced. In the drawings, the wiring GBL in some cases are represented by a bold line or a bold dotted line for increasing visibility. The wiring GBL is referred to as a global bit line in some cases.

The wiring GBL illustrated in FIG. 4 can be provided after the element layer including the OS transistor is formed. For example, as illustrated in a schematic cross-sectional view in FIG. 5A, the wiring GBL can be provided in openings provided on an outer periphery of sealing layers 40A surrounding respective element layers after the element layers including OS transistors are formed. Alternatively, as illustrated in a schematic cross-sectional view in FIG. 5B, the wiring GBL can be provided in openings provided on an outer periphery of a sealing layer 40B surrounding all element layers after the element layers including OS transistors are formed. Note that in FIG. 5A and FIG. 5B, the switch circuit 41 and the like are omitted, and details of each element layer provided with the wiring GBL will be described in Embodiment 3.

<Check Bit Generation Circuit and Error Detection Circuit>

FIG. 6A is a circuit diagram illustrating a structure example of the check bit generation circuit 54. The check bit generation circuit 54 includes an XOR circuit 53_1 to an XOR circuit 53_3. A structure example of the XOR circuit 53 is described later.

Note that for easy understanding, the description of the memory device 10A is made on the assumption that N=5 regarding the element layers 34_1 to 34_N included in the memory cell array 30. One of the element layers 34_1 to 34_5 is used for retaining a check bit, and the other four layers are used for retaining data. In other words, the check bit generation circuit 54 described in this embodiment is a circuit for handling 4-bit data and a check bit that is 1 bit.

The check bit generation circuit 54 includes an input terminal T_A0 to an input terminal T_A3, and 4-bit data represented as a bit A0 to a bit A3 is input thereto. In addition, the check bit generation circuit 54 includes an input terminal T_CK1 to an input terminal T_CK4, and a clock signal CK1 to a clock signal CK4, which are control signals, are input thereto. Moreover, the check bit generation circuit 54 outputs a check bit from an output terminal OUT.

FIG. 6B is a timing chart showing a relation between the clock signal CK1 to the clock signal CK4 input to the check bit generation circuit 54, an input period PDI of the 4-bit data, and an output period PDO of the check bit. Since the high levels and the low levels of the clock signal CK1 to the clock signal CK4 and the 4-bit data are represented by the potential VDD and the potential VSS, they are expressed as Vdd (H) and Vss (L) in FIG. 6B.

FIG. 6C is a truth table where outputs with respect to the 4-bit data input to the check bit generation circuit 54 are expressed as high levels (H) or low levels (L). The truth table in FIG. 6C indicates that the check bit generation circuit 54 outputs a high level (H) when the number of high levels (H) of the bit A0 to the bit A3 is odd, and that the check bit generation circuit 54 outputs a low level (L) when the number of high levels (H) is even or 0.

Figure 7A:
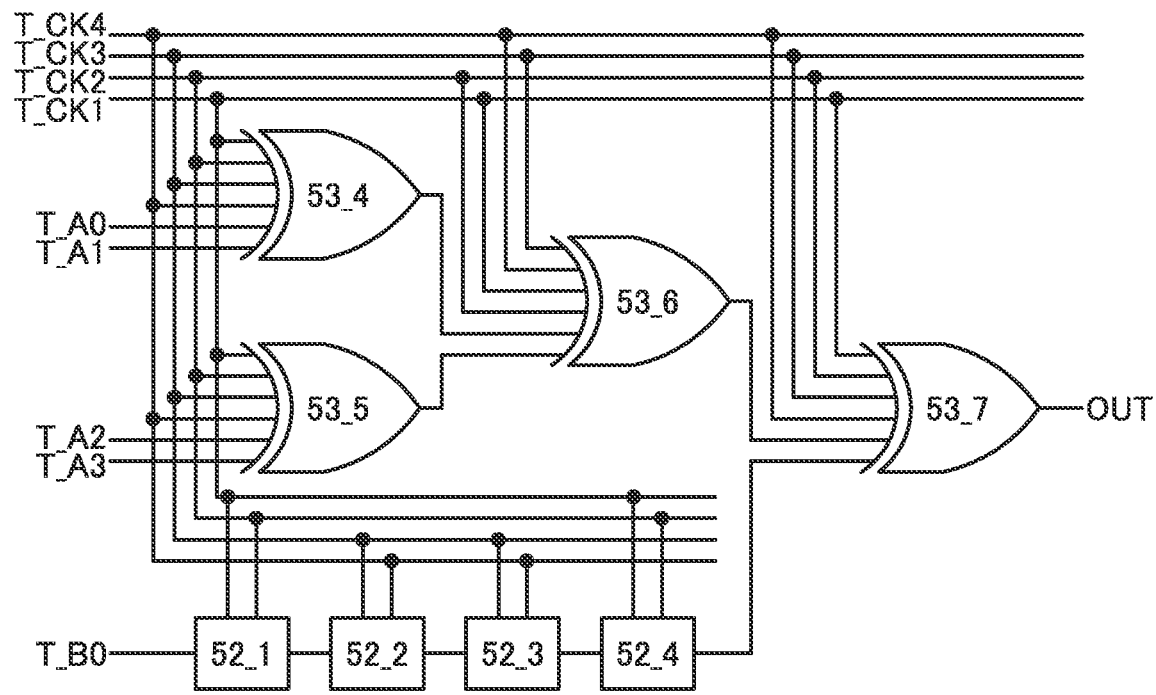
FIG. 7A is a circuit diagram illustrating a structure example of an error detection circuit.

Next, FIG. 7A is a circuit diagram illustrating a structure example of the error detection circuit 55. The error detection circuit 55 includes an XOR circuit 53_4 to an XOR circuit 53_7 and a delay circuit 52_1 to a delay circuit 52_4. Note that a structure example of the delay circuit 52 is described later.

Like the check bit generation circuit 54, the error detection circuit 55 described in this embodiment is a circuit for handling 4-bit data and the check bit that is 1 bit.

The error detection circuit 55 includes an input terminal T_A0 to an input terminal T_A3, and 4-bit data represented as the bit A0 to the bit A3 is input thereto. The error detection circuit 55 includes an input terminal T_CK1 to an input terminal T_CK4, and the clock signal CK1 to the clock signal CK4, which are control signals, are input thereto. In addition, the error detection circuit 55 includes an input terminal T_B0, and a check bit B0 is input thereto. When an error is not found in a relation between the check bit B0 and the bit A0 to the bit A3, the error detection circuit 55 outputs a low level (L) from an output terminal OUT. When an error is found, the error detection circuit 55 outputs a high level (H).

Figure 7B:
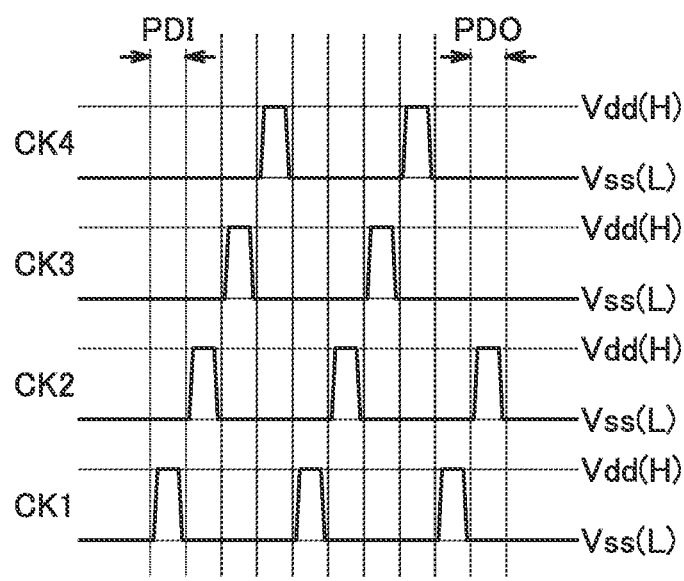
FIG. 7B is a timing chart.

FIG. 7B is a timing chart showing a relation between the clock signal CK1 to the clock signal CK4 input to the error detection circuit 55, an input period PDI of the 4-bit data and the check bit, and an output period PDO of the error detection circuit 55. Since the high levels and the low levels of the clock signal CK1 to the clock signal CK4, the 4-bit data, and the check bit are represented by the potential VDD and the potential VSS, they are expressed as Vdd (H) and Vss (L) in FIG. 7B.

FIG. 8 is a truth table where outputs with respect to the 4-bit data and the check bit input to the error detection circuit 55 are expressed as high levels (H) or low levels (L). The truth table in FIG. 8 indicates that the error detection circuit 55 outputs a high level (H) when the check bit B0 is at a low level (L) and the number of high levels (H) of the bit A0 to the bit A3 is odd. This means that the check bit generation circuit 54 outputs a high level (H) as a check bit when the number of high levels (H) of the bit A0 to the bit A3 is odd, in which case an error is found in the relation between the check bit B0 and the bit A0 to the bit A3.

Furthermore, the truth table in FIG. 8 indicates that the error detection circuit 55 outputs a high level (H) when the check bit B0 is at a high level (H) and the number of high levels (H) of the bit A0 to the bit A3 is even or 0. This means that the check bit generation circuit 54 outputs a low level (L) as a check bit when the number of high levels (H) of the bit A0 to the bit A3 is even or 0, in which case an error is found in the relation between the check bit B0 and the bit A0 to the bit A3.

Thus, with the check bit generation circuit 54, the check bit B0, and the error detection circuit 55, the memory device 10A can conduct a parity check as well as data writing and reading inside the memory device. An output signal of the error detection circuit 55 is output to the column driver 22 through a switch 23_C.

<XOR Circuit, NAND Circuit, and Delay Circuit>

FIG. 9A shows a symbol representing the XOR circuit 53, and FIG. 9B is a circuit diagram illustrating a structure example of the XOR circuit 53. As illustrated in FIG. 9B, the XOR circuit 53 includes a NAND circuit 51_1 to a NAND circuit 51_4, the delay circuit 52_1, and the delay circuit 52_2. The XOR circuit 53 also includes an input terminal D, an input terminal E, and an input terminal C5 to an input terminal C8 to which a control signal S_C5 to a control signal S_C8 are input, and outputs a signal from an output terminal Z.

FIG. 9C is a timing chart showing a relation between the control signal S_C5 to the control signal S_C8 input to the XOR circuit 53, an input period PDI of signals input to the input terminal D and the input terminal E, and an output period PDO of the XOR circuit 53. Since the high levels and the low levels of the control signal S_C5 to the control signal S_C8 and an input signal are represented by the potential VDD and the potential VSS, they are expressed as Vdd (H) and Vss (L).

FIG. 9D is a truth table where outputs with respect to the signal input to the XOR circuit 53 are expressed as high levels (H) and low levels (L). The truth table in FIG. 9D shows the relation between the signals input to the input terminal D and the input terminal E and the signals output from the output terminal Z.

FIG. 10A shows a symbol representing the NAND circuit 51, and FIG. 10B is a circuit diagram illustrating a structure example of the NAND circuit 51. As illustrated in FIG. 10B, the NAND circuit 51 includes a transistor 61 to a transistor 64 and a capacitor C61. The transistor 61 to the transistor 64 are n-channel transistors. Furthermore, the NAND circuit 51 includes an input terminal A, an input terminal B, and an input terminal C1 and an input terminal C2 to which a control signal S_C1 and a control signal S_C2 are input, and outputs a signal from an output terminal X.

FIG. 10C is a timing chart showing a relation between the control signal S_C1 and the control signal S_C2 input to the NAND circuit 51, an input period PDI of signals input to the input terminal A and the input terminal B, and an output period PDO of the NAND circuit 51. Since the high levels and the low levels of the control signal S_C1, the control signal S_C2, and the input signals are represented by the potential VDD and the potential VSS, they are expressed as Vdd (H) and Vss (L) in FIG. 10C.

FIG. 10D is a truth table where outputs with respect to the signals input to the NAND circuit 51 are expressed as high levels (H) and low levels (L). The truth table in FIG. 10D shows the relation between the signals input to the input terminal A and the input terminal B and the signals output to the output terminal X.

FIG. 11A shows a symbol representing the delay circuit 52, and FIG. 11B is a circuit diagram illustrating a structure example of the delay circuit 52. As illustrated in FIG. 11B, the delay circuit 52 includes a transistor 71, a transistor 72, and a capacitor C71. The transistor 71 and the transistor 72 are n-channel transistors. Furthermore, the delay circuit 52 includes an input terminal C and an input terminal C3 and an input terminal C4 to which a control signal S_C3 and a control signal S_C4 are input, and outputs a signal from an output terminal Y.

FIG. 11C is a timing chart showing a relation between the control signal S_C3 and the control signal S_C4 input to the delay circuit 52, an input period PDI of signals input to the input terminal C, and an output terminal PDO of the delay circuit 52. Since the high levels and the low levels of the control signal S_C3, the control signal S_C4, and the input signals are represented by the potential VDD and the potential VSS, they are expressed as Vdd (H) and Vss (L) in FIG. 11C.

FIG. 11D is a truth table where outputs with respect to the signals input to the delay circuit 52 are expressed as high levels (H) and low levels (L). The truth table in FIG. 11D shows the relation between the signals input to the input terminal C and the signals output from the output terminal Y.

<Memory Device>

In the memory device of one embodiment of the present invention, an OS transistor with an extremely low off-state current is used as a transistor provided in each element layer. Since the OS transistor can be stacked over a silicon substrate where a Si transistor is provided, for example, and accordingly can be manufactured in the vertical direction with the same manufacture process repeatedly, resulting in a reduction in the manufacturing cost. In the memory device of one embodiment of the present invention, the transistors included in the memory cells can be arranged not in the plane direction but in the vertical direction, so that the memory density can be improved. Consequently, the memory device can be downsized.

In addition, the memory device of one embodiment of the present invention includes the check bit generation circuit, a check bit, and an error detection circuit. Thus, the memory device of one embodiment of the present invention can conduct a parity check as well as data writing and reading inside the memory device. The check bit generation circuit and the error detection circuit can also be formed using OS transistors; thus, the circuits can be arranged in the vertical direction, so that the memory device can be downsized.

Note that this embodiment can be implemented in combination with the other embodiments described in this specification as appropriate.

Embodiment 2

Figure 12:
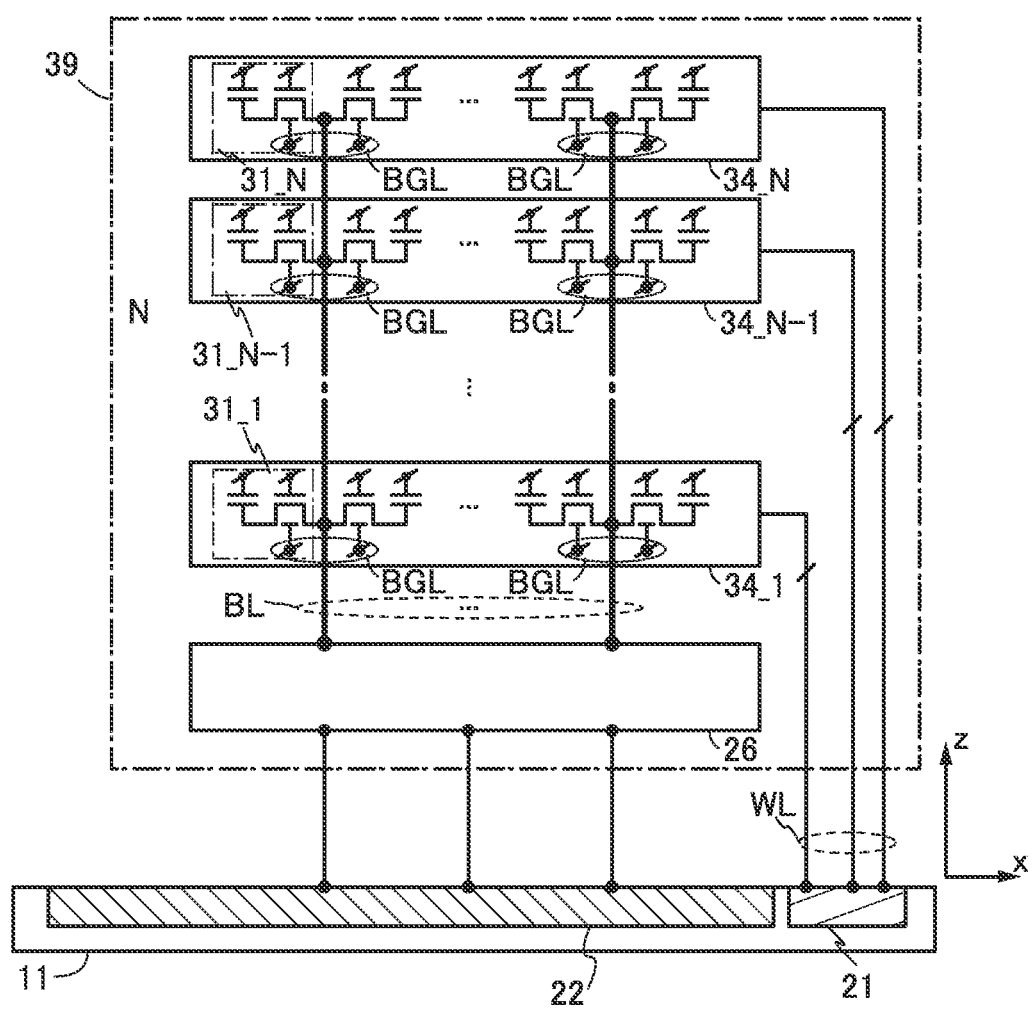
FIG. 12 is a schematic diagram illustrating a structure example of a memory device.

In this embodiment, a modification example of a circuit applicable to the memory device 10A described in Embodiment 1 will be described with reference to FIG. 12.

In FIG. 2 and the like, the transistor with a top gate structure or a bottom gate structure without a back gate electrode is shown as the transistors included in the memory cell 31_1 to the memory cell 31_N and the element layer 26. For example, as in a memory device 10C illustrated in FIG. 12, a transistor with a back gate electrode connected to a back gate electrode line BGL may be used. With the structure illustrated in FIG. 12, the threshold voltage of the transistor can be controlled from the outside.

Note that this embodiment can be implemented in combination with the other embodiments described in this specification as appropriate.

Embodiment 3

An example of a memory device of one embodiment of the present invention will be described below.

Figure 13:
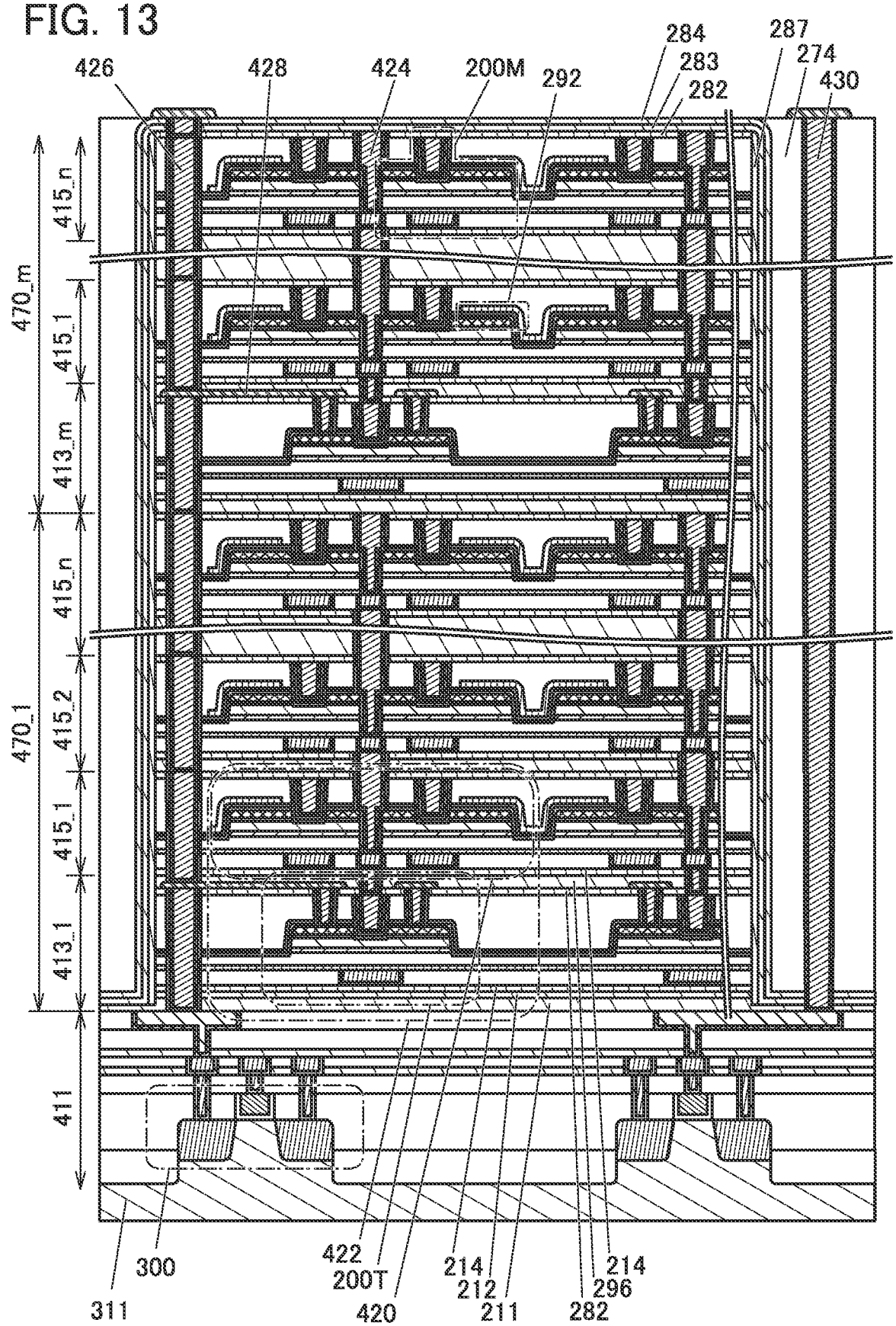
FIG. 13 is a schematic cross-sectional view illustrating a structure example of a memory device.

FIG. 13 illustrates an example of a memory device in which memory units 470 (a memory unit 470_1 to a memory unit 470_m: m is a natural number greater than or equal to 1) are stacked over an element layer 411 including a circuit provided using a semiconductor substrate 311. FIG. 13 shows an example in which the element layer 411 and a plurality of memory units 470 over the element layer 411 are stacked, and each of the memory units 470 is provided with one transistor layer 413 (any one of a transistor layer 413_1 to a transistor layer 413_m) and a plurality of memory device layers 415 (a memory device layer 415_1 to a memory device layer 415n: n is a natural number greater than or equal to 2) over the transistor layer 413. Although the example in which the memory device layers 415 are provided over the transistor layer 413 in each of the memory units 470 is shown, this embodiment is not limited thereto. The transistor layer 413 may be provided over the plurality of memory device layers 415, or the memory device layers 415 may be provided over and below the transistor layer 413.

The element layer 411 includes a transistor 300 provided on the semiconductor substrate 311 and can function as a peripheral circuit of the memory device. Examples of the peripheral circuit include a column driver, a row driver, a column decoder, a row decoder, an amplifier circuit, an input/output circuit, and a control logic circuit.

Each transistor layer 413 includes a transistor 200T and can function as a circuit for controlling each of the memory units 470. Each memory device layer 415 includes a memory device 420. The memory device 420 shown in this embodiment includes a transistor 200M and a capacitor 292.

Although there is no particular limitation on a value of the above m, m is greater than or equal to 1 and less than or equal to 100, preferably greater than or equal to 1 and less than or equal to 50, further preferably greater than or equal to 1 and less than or equal to 10. Although there is no particular limitation on a value of the above n, n is greater than or equal to 2 and less than or equal to 100, preferably greater than or equal to 2 and less than or equal to 50, further preferably greater than or equal to 2 and less than or equal to 100. The product of m and n is greater than or equal to 2 and less than or equal to 256, preferably greater than or equal to 2 and less than or equal to 128, further preferably greater than or equal to 2 and less than or equal to 64.

FIG. 13 is a cross-sectional view in the channel length direction of the transistor 200T and the transistor 200M in the memory unit 470.

As illustrated in FIG. 13, the transistor 300 is provided on the semiconductor substrate 311, the transistor layer 413 and the memory device layer 415 included in the memory unit 470 are provided over the transistor 300, and in one memory unit 470, the transistor 200T included in the transistor layer 413 and the memory device 420 included in the memory device layer 415 are electrically connected via a plurality of conductors 424. The transistor 300 and the transistor 200T included in the transistor layer 413 in each memory unit 470 are electrically connected via a conductor 426. It is preferable that the conductor 426 be electrically connected to the transistor 200T via a conductor 428 electrically connected to any one of a source, a drain, and a gate of the transistor 200T. It is preferable that the conductor 424 be provided in each memory device layer 415. Furthermore, it is preferable that the conductor 426 be provided in each transistor layer 413 and each memory device layer 415.

Although details are described later, it is preferable to provide an insulator that inhibits the passage of oxygen or impurities such as water or hydrogen on side surfaces of the conductor 424 and the conductor 426. As such insulators, silicon nitride, aluminum oxide, or silicon nitride oxide may be used.

The memory device 420 includes the transistor 200M and the capacitor 292, and the transistor 200M can have a structure similar to that of the transistor 200T included in the transistor layer 413. The transistor 200T and the transistor 200M are collectively referred to as the transistor 200, in some cases.

Here, in the transistor 200, a semiconductor which includes a region where a channel is formed is preferably formed using a metal oxide functioning as an oxide semiconductor (hereinafter also referred to as an oxide semiconductor).

As the oxide semiconductor, for example, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. As the oxide semiconductor, an indium oxide, an In—Ga oxide or an In—Zn oxide may be used. Note that when an oxide semiconductor having high proportion of indium is used, the on-state current, the field-effect mobility, or the like of the transistor can be increased.

The transistor 200 using an oxide semiconductor in its channel formation region has an extremely low leakage current in an off state; thus, a memory device with low power consumption can be provided. An oxide semiconductor can be deposited by a sputtering method or the like, and thus can be used for the transistor 200 included in a highly integrated memory device.

In contrast, a transistor including an oxide semiconductor easily has normally-on characteristics (characteristics such that a channel exists without voltage application to a gate electrode and a current flows in a transistor) owing to an impurity and an oxygen vacancy in the oxide semiconductor that affect the electrical characteristics.

In view of this, an oxide semiconductor with a reduced impurity concentration and a reduced density of defect states is preferably used. Note that in this specification and the like, a state with a low impurity concentration and a low density of defect states is referred to as a highly purified intrinsic or substantially highly purified intrinsic state.

Accordingly, the impurity concentration in the oxide semiconductor is preferably reduced as much as possible. Examples of impurities contained in the oxide semiconductor include hydrogen, nitrogen, alkali metal, alkaline earth metal, iron, nickel, and silicon.

Specifically, hydrogen as an impurity which is contained in the oxide semiconductor might form an oxygen vacancy (also referred to as Vo) in the oxide semiconductor. In some cases, a defect that is an oxygen vacancy into which hydrogen enters (hereinafter sometimes referred to as VoH) generates an electron serving as a carrier. In other cases, reaction between part of hydrogen and oxygen bonded to a metal atom generates an electron serving as a carrier.

Thus, a transistor including an oxide semiconductor with a high hydrogen content is likely to be normally on. Hydrogen in the oxide semiconductor is easily transferred by a stress such as heat or an electric field; thus, a high hydrogen content in the oxide semiconductor might reduce the reliability of the transistor.

Therefore, the transistor 200 preferably uses a highly purified intrinsic oxide semiconductor in which oxygen vacancies and impurities such as hydrogen are reduced.

<Sealing Structure>

In view of the above, the transistor 200 is preferably sealed using a material that inhibits diffusion of impurities (hereinafter also referred to as an impurity barrier material) in order to inhibit entry of impurities from the outside.

Note that in this specification and the like, a barrier property means a function of inhibiting diffusion of a targeted substance (or low permeability). Alternatively, a barrier property means a function of trapping and fixing (or gettering) a targeted substance.

Examples of a material that has a function of inhibiting diffusion of hydrogen and oxygen include aluminum oxide, hafnium oxide, gallium oxide, indium gallium zinc oxide, silicon nitride, and silicon nitride oxide. It is particularly preferable to use silicon nitride or silicon nitride oxide as a sealing material because of their high barrier properties against hydrogen.

Examples of a material having a function of trapping and fixing hydrogen include metal oxides such as aluminum oxide, hafnium oxide, gallium oxide, and indium gallium zinc oxide.

As layers having a barrier property, an insulator 211, an insulator 212, and an insulator 214 are preferably provided between the transistor 300 and the transistor 200. A material that inhibits the diffusion or passage of impurities such as hydrogen is used for at least one of the insulator 211, the insulator 212, and the insulator 214, whereby impurities such as hydrogen or water included in the semiconductor substrate 311, the transistor 300, or the like can be inhibited from being diffused into the transistor 200. Furthermore, a material that inhibits the passage of oxygen is used for at least one of the insulator 211, the insulator 212, and the insulator 214, whereby oxygen included in the channel of the transistor 200 or the transistor layer 413 can be inhibited from being diffused into the element layer 411. For example, it is preferable to use a material that inhibits the passage of impurities such as hydrogen or water for the insulator 211 and the insulator 212 and to use a material that inhibits the passage of oxygen for the insulator 214. Furthermore, it is further preferable to use a material having a property of extracting and occluding hydrogen for the insulator 214. As the insulator 211 and the insulator 212, a nitride such as silicon nitride or silicon nitride oxide can be used, for example. As the insulator 214, a metal oxide such as aluminum oxide, hafnium oxide, gallium oxide, or indium gallium zinc oxide can be used, for example. In particular, aluminum oxide is preferably used for the insulator 214.

In addition, an insulator 287 is preferably provided on a side surface of each transistor layer 413 and a side surface of each memory device layer 415, that is, a side surface of each memory unit 470, and an insulator 282 is preferably provided on an top surface of the memory unit 470. In this structure, the insulator 282 is preferably in contact with the insulator 287, and the insulator 287 is preferably in contact with at least one of the insulator 211, the insulator 212, and the insulator 214. For the insulator 287 and the insulator 282, a material that can be used for the insulator 214 is preferably used.

An insulator 283 and an insulator 284 are preferably provided to cover the insulator 282 and the insulator 287, and the insulator 283 is preferably in contact with at least one of the insulator 211, the insulator 212, and the insulator 214. FIG. 13 shows an example in which the insulator 287 is in contact with a side surface of the insulator 214, a side surface of the insulator 212, and a top surface and a side surface of the insulator 211 and in which the insulator 283 is in contact with a side surface of the insulator 287 and the top surface of the insulator 211; however, this embodiment is not limited to this structure. The insulator 287 may be in contact with the side surface of the insulator 214 and a top surface and the side surface of the insulator 212, and the insulator 283 may be in contact with the side surface of the insulator 287 and the top surface of the insulator 212. For the insulator 282 and the insulator 287, a material that can be used for the insulator 211 and the insulator 212 is preferably used.

In the above structure, a material that can inhibit the passage of oxygen is preferably used for the insulator 287 and the insulator 282. For the insulator 287 and the insulator 282, it is further preferable to use a material having a property of trapping and fixing hydrogen. When a material having a function of trapping and fixing hydrogen is used on a side closer to the transistor 200, hydrogen in the transistor 200 or the memory unit 470 is trapped and fixed by the insulator 214, the insulator 287, and the insulator 282, whereby the hydrogen concentration in the transistor 200 can be reduced. Furthermore, for the insulator 283 and the insulator 284, a material that inhibits the passage of impurities such as hydrogen or water is preferably used.

With the above structure, the memory unit 470 is surrounded by the insulator 211, the insulator 212, the insulator 214, the insulator 287, the insulator 282, the insulator 283, and the insulator 284. Specifically, the memory unit 470 is surrounded by the insulator 214, the insulator 287, and the insulator 282 (denoted by a first structure body in some cases), the memory unit 470 and the first structure body are surrounded by the insulator 211, the insulator 212, the insulator 283, and the insulator 284 (denoted by a second structure body in some cases). Such a structure in which the memory unit 470 is surrounded by two or more structure bodies is referred to as a nested structure in some cases. Here, a state where the memory unit 470 is surrounded by a plurality of structure bodies is denoted by a state where the memory unit 470 is sealed by a plurality of insulators, in some cases.

The second structure body seals the transistor 200 with the first structure body therebetween. Thus, the second structure body inhibits hydrogen existing outward the second structure body from being diffused into an inside of the second structure body (to the transistor 200 side). That is, the first structure body can efficiently trap and fix hydrogen existing in an internal structure of the second structure body.

In the above structure, specifically, a metal oxide such as aluminum oxide can be used for the first structure body and a nitride such as silicon nitride can be used for the second structure body. More specifically, an aluminum oxide film is preferably provided between the transistor 200 and a silicon nitride film.

Furthermore, by appropriately setting deposition conditions for the material used for the structure bodies, their hydrogen concentrations can be reduced.

In general, a film deposited by a CVD method has more favorable coverage than a film deposited by a sputtering method. On the other hand, many compound gases used for a CVD method contain hydrogen and a film deposited by a CVD method has higher hydrogen content than a film formed by a sputtering method.

Accordingly, it is preferable to use a film with a reduced hydrogen concentration (specifically, a film formed by a sputtering method) as a film which is close to the transistor 200, for example. Meanwhile, in the case where a film that has favorable coverage as well as a relatively high hydrogen concentration (specifically, a film deposited by a CVD method) is used as a film for inhibiting impurity diffusion, it is preferable that a film having a function of trapping and fixing hydrogen and a reduced hydrogen concentration be provided between the transistor 200 and the film that has favorable coverage as well as a relatively high hydrogen concentration.

In other words, a film with a relatively low hydrogen concentration is preferably used as the film which is close to the transistor 200. In contrast, a film with a relatively high hydrogen concentration is preferably provided apart from the transistor 200.

When the above structure is employed and specifically, the transistor 200 is sealed with a silicon nitride film deposited by a CVD method, an aluminum oxide film deposited by a sputtering method is preferably provided between the transistor 200 and the silicon nitride film deposited by a CVD method. It is further preferable that a silicon nitride film deposited by a sputtering method be provided between the silicon nitride film deposited by a CVD method and the aluminum oxide film deposited by a sputtering method.

Note that in the case where a CVD method is employed for deposition, a compound gas containing no hydrogen atom or having a low hydrogen atom content may be used for the deposition to reduce the hydrogen concentration of the deposited film.

Furthermore, the insulator 282 and the insulator 214 are preferably provided also between each transistor layer 413 and the memory device layer 415 or between the memory device layers 415. Moreover, an insulator 296 is preferably provided between the insulator 282 and the insulator 214. A material similar to that for the insulator 283 and the insulator 284 can be used for the insulator 296. Alternatively, silicon oxide or silicon oxynitride can be used. Alternatively, a known insulating material may be used. Here, the insulator 282, the insulator 296, and the insulator 214 may be elements included in the transistor 200. The insulator 282, the insulator 296, and the insulator 214 preferably serve as component elements of the transistor 200 because the number of steps needed to manufacture the memory device can be reduced.

It is preferable that the insulator 287 be in contact with the side surfaces of the insulator 282, the insulator 296, and the insulator 214 provided between each transistor layer 413 and the memory device layer 415 or between the memory device layers 415. With such a structure, each transistor layer 413 and each memory device layer 415 are surrounded and sealed by the insulator 282, the insulator 296, the insulator 214, the insulator 287, the insulator 283, and the insulator 284.

Furthermore, an insulator 274 may be provided around the insulator 284. Moreover, a conductor 430 may be provided to be embedded in the insulator 274, the insulator 284, the insulator 283, and the insulator 211. The conductor 430 is electrically connected to the transistor 300, that is, the circuit included in the element layer 411.

In each memory device layer 415, the capacitor 292 is formed in the layer where the transistor 200M is provided, and accordingly, the height of the memory device 420 can be almost the same as that of the transistor 200M, which enables each memory device layer 415 to be prevented from having excessively large height. Thus, the number of memory device layers 415 can be increased relatively easily. For example, the number of stacked structures each including the transistor layer 413 and the memory device layers 415 can be approximately 100.

<Transistor 200>

Figure 14A:
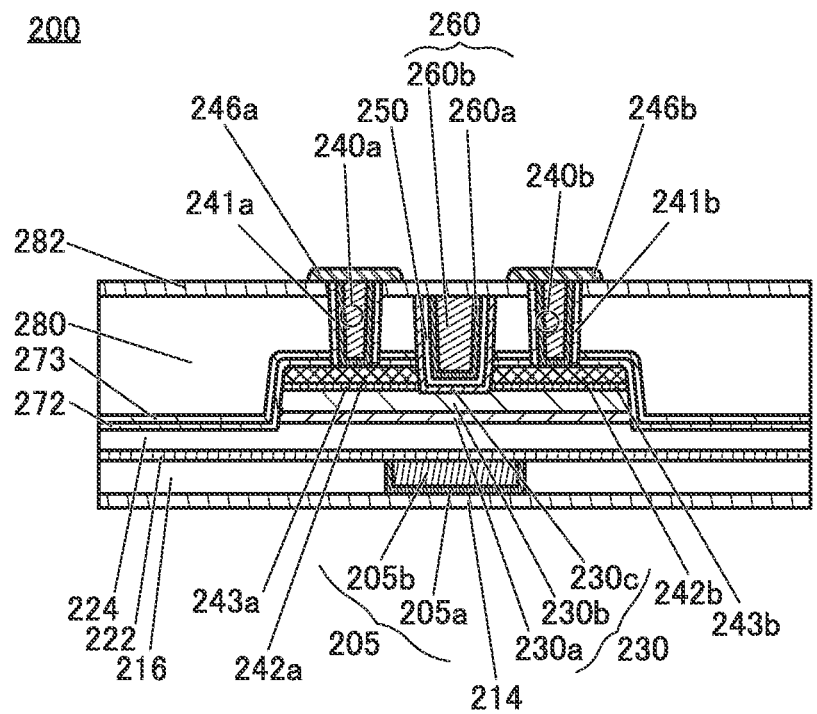
FIG. 14A and FIG. 14B are schematic cross-sectional views illustrating a structure example of a transistor.

With reference to FIG. 14A, will be described the transistor 200 that can be used for the transistor 200T included in the transistor layer 413 and the transistor 200M included in the memory device 420.

As illustrated in FIG. 14A, the transistor 200 includes an insulator 216, a conductor 205 (a conductor 205a and a conductor 205b), an insulator 222, an insulator 224, an oxide 230 (an oxide 230a, an oxide 230b, and an oxide 230c), a conductor 242 (a conductor 242a and a conductor 242b), an oxide 243 (an oxide 243a and an oxide 243b), an insulator 272, an insulator 273, an insulator 250, and a conductor 260 (a conductor 260a and a conductor 260b).

The insulator 216 and the conductor 205 are provided over the insulator 214, and an insulator 280 and the insulator 282 are provided over the insulator 273. The insulator 214, the insulator 280, and the insulator 282 can be regarded as part of the transistor 200.

The memory device of one embodiment of the present invention also includes a conductor 240 (a conductor 240a and a conductor 240b) electrically connected to the transistor 200 and functioning as a plug. Note that an insulator 241 (an insulator 241a and an insulator 241b) is provided in contact with a side surface of the conductor 240 functioning as a plug. A conductor 246 (a conductor 246a and a conductor 246b) electrically connected to the conductor 240 and functioning as a wiring is provided over the insulator 282 and the conductor 240.

The conductor 240a and the conductor 240b are each preferably formed using a conductive material containing tungsten, copper, or aluminum as its main component. The conductor 240a and the conductor 240b may have a stacked-layer structure.

When the conductor 240 has a stacked-layer structure, it is preferable to use a conductive material having a function of inhibiting penetration of oxygen and impurities such as water and hydrogen. For example, tantalum, tantalum nitride, titanium, titanium nitride, ruthenium, or ruthenium oxide is preferably used. The conductive material having a function of inhibiting penetration of oxygen and impurities such as water and hydrogen may have a single-layer structure or a stacked-layer structure. With use of the conductive material, entry of impurities such as water and hydrogen diffused from the insulator 280 or the like into the oxide 230 through the conductor 240a and the conductor 240b can be further reduced. Furthermore, oxygen added to the insulator 280 can be prevented from being absorbed by the conductor 240a and the conductor 240b.

For the insulator 241 provided in contact with the conductor 240, for example, silicon nitride, aluminum oxide, silicon nitride oxide, or the like can be used. Since the insulator 241 is provided in contact with the insulator 272 and the insulator 273, the insulator 280, and the insulator 282, impurities such as water or hydrogen can be inhibited from being mixed into the oxide 230 through the conductor 240a and the conductor 240b from the insulator 280 or the like. In particular, silicon nitride is suitable because of its high hydrogen blocking property. Furthermore, oxygen contained in the insulator 280 can be prevented from being absorbed by the conductor 240a and the conductor 240b.

The conductor 246 is preferably formed using a conductive material containing tungsten, copper, or aluminum as its main component. Furthermore, the conductor may have a stacked-layer structure and may be a stack of titanium or titanium nitride and any of the above conductive materials, for example. Note that the conductor may be embedded in an opening provided in an insulator.

In the transistor 200, the conductor 260 functions as a first gate of the transistor and the conductor 205 functions as a second gate of the transistor. The conductor 242a and the conductor 242b serve as a source electrode and a drain electrode.

The oxide 230 functions as a semiconductor including a channel formation region.

The insulator 250 function as a first gate insulator, and the insulator 222 and the insulator 224 function as a second gate insulator.

Here, in the transistor 200 illustrated in FIG. 14A, the conductor 260 is formed in a self-aligned manner in an opening provided in the insulator 280, the insulator 273, the insulator 272, the conductor 242, and the like, with the oxide 230c and the insulator 250 positioned therebetween.

In other words, the conductor 260 is formed to fill the opening provided in the insulator 280 and the like, with the oxide 230c and the insulator 250 positioned therebetween; therefore, alignment of the conductor 260 in the region between the conductor 242a and the conductor 242b is not needed.

The oxide 230c is preferably provided in the opening that is provided in the insulator 280 and the like. Thus, the insulator 250 and the conductor 260 include a region that overlaps with a stacked-layer structure of the oxide 230b and the oxide 230a with the oxide 230c therebetween. When this structure is employed, the oxide 230c and the insulator 250 can be sequentially formed and thus, the interface between the oxide 230 and the insulator 250 can be kept clean. Accordingly, the influence of interface scattering on carrier conduction is small, and the transistor 200 can have a high on-state current and high frequency characteristics.

In the transistor 200 illustrated in FIG. 14A, a bottom surface and a side surface of the conductor 260 are in contact with the insulator 250. Furthermore, a bottom surface and a side surface of the insulator 250 are in contact with the oxide 230c.

In addition, the insulator 282 and the oxide 230c are in direct contact with each other in the transistor 200 as illustrated in FIG. 14A. Owing to this structure, diffusion of oxygen contained in the insulator 280 to the conductor 260 can be inhibited.

Therefore, oxygen contained in the insulator 280 can be efficiently supplied to the oxide 230a and the oxide 230b through the oxide 230c, which can reduce oxygen vacancies in the oxide 230a and the oxide 230b and improve the electrical characteristics and reliability of the transistor 200.

The structure of the memory device including the transistor 200 of one embodiment of the present invention is described in detail below.

In the transistor 200, an oxide semiconductor is preferably used as the oxide 230 (the oxide 230a, the oxide 230b, and the oxide 230c) including a channel formation region.

For example, the metal oxide functioning as an oxide semiconductor preferably has an energy gap of 2 eV or more, further preferably 2.5 eV or more. With use of a metal oxide having a wide energy gap, leakage current in a non-conduction state (off-state current) of the transistor 200 can be extremely small. The use of such a transistor can provide a memory device with low power consumption.

Specifically, as the oxide 230, a metal oxide such as an In-M-Zn oxide (the element M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Alternatively, an In-M oxide, an In—Zn oxide, or an M-Zn oxide may be used as the oxide 230.

As illustrated in FIG. 14A, the oxide 230 preferably includes the oxide 230a over the insulator 224, the oxide 230b over the oxide 230a, and the oxide 230c that is over the oxide 230b and at least part of which is in contact with the top surface of the oxide 230b. Note that the side surface of the oxide 230c is preferably in contact with the oxide 243a, the oxide 243b, the conductor 242a, the conductor 242b, the insulator 272, the insulator 273, and the insulator 280.

That is, the oxide 230 includes the oxide 230a, the oxide 230b over the oxide 230a, and the oxide 230c over the oxide 230b. When the oxide 230a is provided below the oxide 230b, impurities can be inhibited from diffusing into the oxide 230b from the components formed below the oxide 230a. When the oxide 230c is provided over the oxide 230b, impurities can be inhibited from diffusing into the oxide 230b from the components formed above the oxide 230c.

The transistor 200 has a structure in which the three layers of the oxide 230a, the oxide 230b, and the oxide 230c are stacked in a channel formation region and its vicinity; however, the present invention is not limited to this structure. For example, the transistor 200 may include a single layer of the oxide 230b, a two-layer stack of the oxide 230b and the oxide 230a, a two-layer stack of the oxide 230b and the oxide 230c, or a four or more-layer stack. For example, the transistor 200 may include a four-layer stack including the oxide 230c with a two-layer structure.

The oxide 230 preferably has a stacked-layer structure of oxide layers which differ in the atomic ratio of metal atoms. Specifically, the atomic ratio of the element M to constituent elements in the metal oxide used as the oxide 230a is preferably greater than that in the metal oxide used as the oxide 230b. Moreover, the atomic ratio of the element M to In in the metal oxide used as the oxide 230a is preferably greater than that in the metal oxide used as the oxide 230b. Moreover, the atomic ratio of In to the element M in the metal oxide used as the oxide 230b is preferably greater than that in the metal oxide used as the oxide 230a. The oxide 230c can be formed using a metal oxide which can be used as the oxide 230a or the oxide 230b.

Specifically, for the oxide 230a, a metal oxide having In:Ga:Zn=1:3:4 [atomic ratio] or a composition in the vicinity thereof, or 1:1:0.5 [atomic ratio] or a composition in the vicinity thereof is used. As the oxide 230b, a metal oxide with In:Ga:Zn=4:2:3 [atomic ratio] or a composition in the vicinity thereof or 1:1:1 [atomic ratio] or a composition in the vicinity thereof is used. As the oxide 230c, a metal oxide having an atomic ratio of In:Ga:Zn=1:3:4 [atomic ratio] or in the vicinity thereof, In:Ga:Zn=4:2:3 [atomic ratio] or in the vicinity thereof, In:Ga:Zn=5:1:3 [atomic ratio] or in the vicinity thereof, In:Ga:Zn=10:1:3 [atomic ratio] or in the vicinity thereof, Ga:Zn=2:1 [atomic ratio] or in the vicinity thereof, or Ga:Zn=2:5 [atomic ratio] or in the vicinity thereof can be used. When the oxide 230c has a stacked-layer structure, a stacked layer structure of a metal oxide having an atomic ratio of In:Ga:Zn=4:2:3 [atomic ratio] or in the vicinity thereof and a metal oxide having an atomic ratio of In:Ga:Zn=1:3:4 [atomic ratio] or in the vicinity thereof, a stacked-layer structure of a metal oxide having an atomic ratio of In:Ga:Zn=4:2:3 [atomic ratio] or in the vicinity thereof and a metal oxide having an atomic ratio of In:Ga:Zn=5:1:3 [atomic ratio] or in the vicinity thereof, a stacked-layer structure of a metal oxide having an atomic ratio of Ga:Zn=2:1 [atomic ratio] or in the vicinity thereof and a metal oxide having an atomic ratio of In:Ga:Zn=4:2:3 [atomic ratio] or in the vicinity thereof, a stacked-layer structure of a metal oxide having an atomic ratio of Ga:Zn=2:5 [atomic ratio] or in the vicinity thereof and a metal oxide having an atomic ratio of In:Ga:Zn=4:2:3 [atomic ratio] or in the vicinity thereof, or a stacked-layer structure of gallium oxide and a metal oxide having an atomic ratio of In:Ga:Zn=4:2:3 [atomic ratio] or in the vicinity thereof can be given as specific examples. Note that a composition in the vicinity includes ±30% of an intended atomic ratio.

The oxide 230b may have crystallinity. For example, it is preferable to use a CAAC-OS (c-axis-aligned crystalline oxide semiconductor) described later. An oxide having crystallinity, such as a CAAC-OS, has a dense structure with small amounts of impurities and defects (e.g., oxygen vacancies) and high crystallinity. Accordingly, extraction of oxygen from the oxide 230b by the source electrode or the drain electrode can be suppressed. This inhibits extraction of oxygen from the oxide 230b even when heat treatment is performed; hence, the transistor 200 is stable with respect to high temperatures in the manufacturing process (i.e., thermal budget).

The conductor 205 is positioned to overlap with the oxide 230 and the conductor 260. The conductor 205 is preferably provided to be embedded in the insulator 216.

In the case where the conductor 205 functions as a gate electrode, by changing a potential applied to the conductor 205 independently of a potential applied to the conductor 260, the threshold voltage (Vth) of the transistor 200 can be controlled. In particular, by applying a negative potential to the conductor 205, Vth of the transistor 200 can be higher, and its off-state current can be reduced. Thus, a drain current at the time when a potential applied to the conductor 260 is 0 V can be smaller in the case where a negative potential is applied to the conductor 205 than in the case where the negative potential is not applied to the conductor 205.

As illustrated in FIG. 14A, the conductor 205 is preferably provided to be larger than a region of the oxide 230 that does not overlap with the conductor 242a or the conductor 242b. Although not illustrated, the conductor 205 preferably extends to a region beyond the oxide 230a and the oxide 230b in the channel width direction of the oxide 230. That is, the conductor 205 and the conductor 260 preferably overlap with each other with the insulator therebetween, in a region beyond the side surface of the oxide 230 in the channel width direction. Forming the conductor 205 with a large area can reduce local charging (charge up) in a treatment using plasma of a manufacturing step after forming the conductor 205 in some cases. However, one embodiment of the present invention is not limited thereto. The conductor 205 overlaps with at least the oxide 230 positioned between the conductor 242a and the conductor 242b.

When the bottom surface of the insulator 224 is used as a benchmark, the bottom surface of the conductor 260 in a region not overlapping with the oxide 230a or the oxide 230b is preferably positioned below the bottom surface of the oxide 230b.

As not illustrated, in the channel width direction, when the conductor 260 functioning as a gate covers a side surface and a top surface of the oxide 230b in the channel formation region with the oxide 230c and the insulator 250 therebetween, the electric field generated from the conductor 260 is likely to affect the entire channel formation region formed in the oxide 230b. Accordingly, the transistor 200 can have a higher on-state current and higher frequency characteristics. In this specification, such a transistor structure in which the channel formation region is electrically surrounded by the electric fields of conductor 260 and the conductor 205 is referred to as surrounded channel (S-channel) structure.

The conductor 205a preferably inhibits penetration of oxygen and impurities such as water or hydrogen. For example, the conductor 205a can be formed using titanium, titanium nitride, tantalum, or tantalum nitride. The conductor 205b is preferably formed using a conductive material containing tungsten, copper, or aluminum as its main component. The conductor 205 has a two-layer structure in the drawing but may have a multilayer structure of three or more layers.

Note that the oxide semiconductor, the insulator or conductor positioned below the oxide semiconductor, and the insulator or conductor positioned over the oxide semiconductor are preferably successively formed without exposure to the air, in which case a substantially highly purified intrinsic oxide semiconductor film with a reduced concentration of impurities (in particular, hydrogen and water) can be formed.

At least one of the insulator 222, the insulator 272, and the insulator 273 preferably functions as a barrier insulating film that inhibits entry of impurities such as water or hydrogen into the transistor 200 from the substrate side or from above the transistor 200. Therefore, at least one of the insulator 222, the insulator 272, and the insulator 273 is preferably formed using an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material through which the above impurities are less likely to pass. Alternatively, it is preferable to use an insulating material that has a function of inhibiting diffusion of oxygen (e.g., at least one of an oxygen atom, an oxygen molecule, and the like) (through which the above oxygen is less likely to pass).

For example, it is preferable that silicon nitride, silicon nitride oxide, or the like be used for the insulator 273 and that aluminum oxide, hafnium oxide, or the like be used for the insulator 222 and the insulator 272.

Accordingly, it is possible to inhibit diffusion of impurities such as water or hydrogen to the transistor 200 side from the substrate side through the insulator 222. It is also possible to inhibit diffusion of oxygen contained in the insulator 224 and the like to the substrate side through the insulator 222.

Impurities such as water or hydrogen can be inhibited from diffusing to the transistor 200 side from the insulator 280 and the like, which are positioned with the insulator 272 and the insulator 273 therebetween. In this manner, the transistor 200 is preferably surrounded by the insulator 272 and the insulator 273 that have a function of inhibiting diffusion of oxygen and impurities such as water or hydrogen.

Here, it is preferable that the insulator 224 in contact with the oxide 230 release oxygen by heating. In this specification and the like, oxygen that is released by heating is referred to as excess oxygen in some cases. For example, silicon oxide, silicon oxynitride, or the like may be used for the insulator 224 as appropriate. When such an insulator containing oxygen is provided in contact with the oxide 230, oxygen vacancies in the oxide 230 can be reduced, leading to an improvement in reliability of the transistor 200.

Specifically, the insulator 224 is preferably formed using an oxide material that releases part of oxygen by heating. An oxide that releases oxygen by heating is an oxide film in which the number of released oxygen molecules is greater than or equal to $1.0 \times 10^{18}$ molecules/cm$^3$, preferably greater than or equal to $1.0 \times 10^{19}$ molecules/cm$^3$, further preferably greater than or equal to $2.0 \times 10^{19}$ molecules/cm$^3$ or greater than or equal to $3.0 \times 10^{20}$ molecules/cm$^3$ in thermal desorption spectroscopy analysis (TDS analysis). Note that the temperature of the film surface in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits entry of impurities such as water or hydrogen into the transistor 200 from the substrate side. For example, the insulator 222 preferably has a lower hydrogen permeability than the insulator 224. When the insulator 224, the oxide 230, and the like are surrounded by the insulator 222 and the insulator 273, entry of impurities such as water or hydrogen into the transistor 200 from the outside can be inhibited.

Furthermore, the insulator 222 preferably has a function of inhibiting diffusion of oxygen (e.g., at least one of oxygen atoms, oxygen molecules, and the like); that is, it is preferable that oxygen is less likely to pass through the insulator 222. For example, the insulator 222 preferably has a lower oxygen permeability than the insulator 224. The insulator 222 preferably has a function of inhibiting diffusion of oxygen or impurities, in which case diffusion of oxygen contained in the oxide 230 into a layer under the insulator 222 can be reduced. Furthermore, the conductor 205 can be inhibited from reacting with oxygen in the insulator 224 or the oxide 230.

As the insulator 222, an insulator containing an oxide of one or both of aluminum and hafnium that is an insulating material is preferably used. For the insulator containing an oxide of one or both of aluminum and hafnium, aluminum oxide, hafnium oxide, an oxide containing aluminum and hafnium (hafnium aluminate), or the like is preferably used. The insulator 222 formed of such a material functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

The insulator 222 may have a single-layer structure or a stacked-layer structure using an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST). With miniaturization and high integration of a transistor, a problem such as generation of leakage current may arise because of a thin gate insulator. When a high-k material is used for an insulator functioning as the gate insulator, a gate potential at the time of operating the transistor can be reduced while the physical thickness of the gate insulator is kept.

Note that the insulator 222 and the insulator 224 may each have a stacked-layer structure of two or more layers. In that case, the stacked layers are not necessarily formed of the same material and may be formed of different materials.

The oxide 243 (the oxide 243a and the oxide 243b) may be positioned between the oxide 230b and the conductor 242 (the conductor 242a and the conductor 242b) which functions as the source electrode or the drain electrode. This structure in which the conductor 242 and the oxide 230b are not in contact with each other can prevent the conductor 242 from absorbing oxygen in the oxide 230b. That is, preventing the oxidation of the conductor 242 can inhibit a decrease in the conductivity of the conductor 242. Accordingly, the oxide 243 preferably has a function of inhibiting the oxidation of the conductor 242.

The oxide 243 having a function of inhibiting penetration of oxygen is preferably provided between the oxide 230b and the conductor 242 functioning as the source electrode and the drain electrode, in which case the electric resistance between the conductor 242 and the oxide 230b can be reduced. Such a structure improves the electrical characteristics of the transistor 200 and reliability of the transistor 200.

As the oxide 243, for example, a metal oxide including an element M that is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like is preferably used. In particular, aluminum, gallium, yttrium, or tin is preferably used as the element M. The concentration of the element M in the oxide 243 is preferably higher than that in the oxide 230b. Alternatively, gallium oxide may be used for the oxide 243. Further alternatively, a metal oxide such as an In-M-Zn oxide may be used for the oxide 243. Specifically, the atomic ratio of the element M to In in the metal oxide used for the oxide 243 is preferably higher than that in the metal oxide used for the oxide 230b. The thickness of the oxide 243 is preferably greater than or equal to 0.5 nm and less than or equal to 5 nm, further preferably greater than or equal to 1 nm and less than or equal to 3 nm. The oxide 243 preferably has crystallinity. With the oxide 243 having crystallinity, release of oxygen in the oxide 230 can be favorably inhibited. When the oxide 243 has a hexagonal crystal structure, for example, release of oxygen in the oxide 230 can sometimes be inhibited.

Note that the oxide 243 is not necessarily provided. In that case, contact between the conductor 242 (the conductor 242a and the conductor 242b) and the oxide 230 may make oxygen in the oxide 230 diffuse into the conductor 242, resulting in oxidation of the conductor 242. It is highly probable that oxidation of the conductor 242 lowers the conductivity of the conductor 242. Note that the expression "oxygen in the oxide 230 diffuses into the conductor 242" can be replaced with the expression "the conductor 242 absorbs oxygen in the oxide 230".

When oxygen in the oxide 230 is diffused into the conductor 242 (the conductor 242a and the conductor 242b), another layer is sometimes formed between the conductor 242a and the oxide 230b, and between the conductor 242b and the oxide 230b. The another layer contains a larger amount of oxygen than the conductor 242 and thus presumably has an insulating property. In that case, a three-layer structure of the conductor 242, the another layer, and the oxide 230b can be regarded as a three-layer structure of a metal, an insulator, and a semiconductor and is sometimes referred to as an MIS (Metal-Insulator-Semiconductor) structure or a diode-connected structure mainly with an MIS structure.

The another layer is not necessarily formed between the conductor 242 and the oxide 230b; for example, the another layer may be formed between the conductor 242 and the oxide 230c or formed between the conductor 242 and the oxide 230b and between the conductor 242 and the oxide 230c.

The conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

It is preferable that the insulator 272 be provided in contact with the top surface of the conductor 242 and function as a barrier layer. Such a structure can inhibit the conductor 242 from absorbing excess oxygen contained in the insulator 280. Furthermore, inhibiting the oxidation of the conductor 242 can suppress an increase in the contact resistance between the transistor 200 and the wiring. Accordingly, the transistor 200 can have excellent electrical characteristics and reliability.

Thus, the insulator 272 preferably has a function of inhibiting oxygen diffusion. For example, the insulator 272 preferably has a function of further inhibiting diffusion of oxygen as compared to the insulator 280. For example, an insulator containing an oxide of one or both of aluminum and hafnium is preferably formed as the insulator 272. For another example, an insulator containing aluminum nitride may be used as the insulator 272.

As illustrated in FIG. 14A, the insulator 272 is in contact with part of the top surface of the conductor 242b and the side surface of the conductor 242b. In addition, although not illustrated, the insulator 272 is in contact with part of the top surface of the conductor 242a and the side surface the conductor 242a. The insulator 273 is provided over the insulator 272. Such a structure can inhibit the conductor 242 from absorbing oxygen added to the insulator 280, for example.

The insulator 250 functions as a gate insulator. The insulator 250 is preferably in contact with a top surface of the oxide 230c. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. In particular, silicon oxide and silicon oxynitride, which have thermal stability, are preferable.

Like the insulator 224, the insulator 250 is preferably formed using an insulator from which oxygen is released by heating. When the insulator from which oxygen is released by heating is provided as the insulator 250 to be in contact with the top surface of the oxide 230c, oxygen can be effectively supplied to the channel formation region of the oxide 230b. Furthermore, as in the insulator 224, the concentration of impurities such as water or hydrogen in the insulator 250 is preferably lowered. The thickness of the insulator 250 is preferably greater than or equal to 1 nm and less than or equal to 20 nm.

A metal oxide may be provided between the insulator 250 and the conductor 260. The metal oxide preferably prevents oxygen diffusion from the insulator 250 into the conductor 260. Providing the metal oxide that inhibits oxygen diffusion inhibits diffusion of oxygen from the insulator 250 to the conductor 260. That is, the reduction in the amount of oxygen supplied to the oxide 230 can be inhibited. Moreover, oxidation of the conductor 260 due to oxygen in the insulator 250 can be inhibited.

The metal oxide functions as part of the gate insulator in some cases. For that reason, when silicon oxide, silicon oxynitride, or the like is used for the insulator 250, the metal oxide is preferably a high-k material with a high dielectric constant. The gate insulator having a stacked-layer structure of the insulator 250 and the metal oxide can be thermally stable and have a high dielectric constant. Accordingly, a gate potential that is applied during operation of the transistor can be reduced while the physical thickness of the gate insulator is kept. In addition, the equivalent oxide thickness (EOT) of the insulator functioning as the gate insulator can be reduced.

Specifically, a metal oxide containing one or more of hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, for example, aluminum oxide, hafnium oxide, or an oxide containing aluminum and hafnium (hafnium aluminate).

The metal oxide functions as part of the gate in some cases. In this case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate, a conductive material containing oxygen and a metal element contained in a metal oxide in which a channel is formed. A conductive material containing any of the above metal elements and nitrogen may also be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With use of such a material, hydrogen contained in the metal oxide in which a channel is formed can be captured in some cases. Alternatively, hydrogen entering from an external insulator or the like can be captured in some cases.

Although the conductor 260 has a two-layer structure in FIG. 14A, a single-layer structure or a stacked-layer structure of three or more layers may be employed.

The conductor 260a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting diffusion of oxygen, the conductivity can be prevented from being lowered because of oxidization of the conductor 260b due to oxygen in the insulator 250. As a conductive material having a function of inhibiting oxygen diffusion, tantalum, tantalum nitride, ruthenium, or ruthenium oxide is preferably used, for example.

Furthermore, the conductor 260b is preferably formed using a conductive material including tungsten, copper, or aluminum as its main component. The conductor 260 also functions as a wiring, and thus a conductor having high conductivity is preferably used for the conductor 260b. For example, a conductive material containing tungsten, copper, or aluminum as its main component can be used. The conductor 260b may have a stacked-layer structure, for example, a stacked-layer structure of titanium or titanium nitride and the above conductive material.

<Metal Oxide>

As the oxide 230, a metal oxide functioning as an oxide semiconductor is preferably used. A metal oxide that can be used as the oxide 230 according to the present invention is described below.

The metal oxide contains preferably at least indium or zinc and particularly preferably indium and zinc. Moreover, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here the case where the metal oxide is an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is considered. In particular, aluminum, gallium, yttrium, or tin is preferably used as the element M.

Note that in this specification and the like, a metal oxide containing nitrogen is also collectively referred to as a metal oxide in some cases. A metal oxide containing nitrogen may be referred to as a metal oxynitride.

<Transistor 300>

The transistor 300 will be described with reference to FIG. 14B. The transistor 300 is provided on the semiconductor substrate 311 and includes a conductor 316 functioning as a gate, an insulator 315 functioning as a gate insulator, a semiconductor region 313 that is a part of the semiconductor substrate 311, and a low-resistance region 314a and a low-resistance region 314b functioning as a source region and a drain region. The transistor 300 may be a p-channel transistor or an n-channel transistor.

Figure 14B:
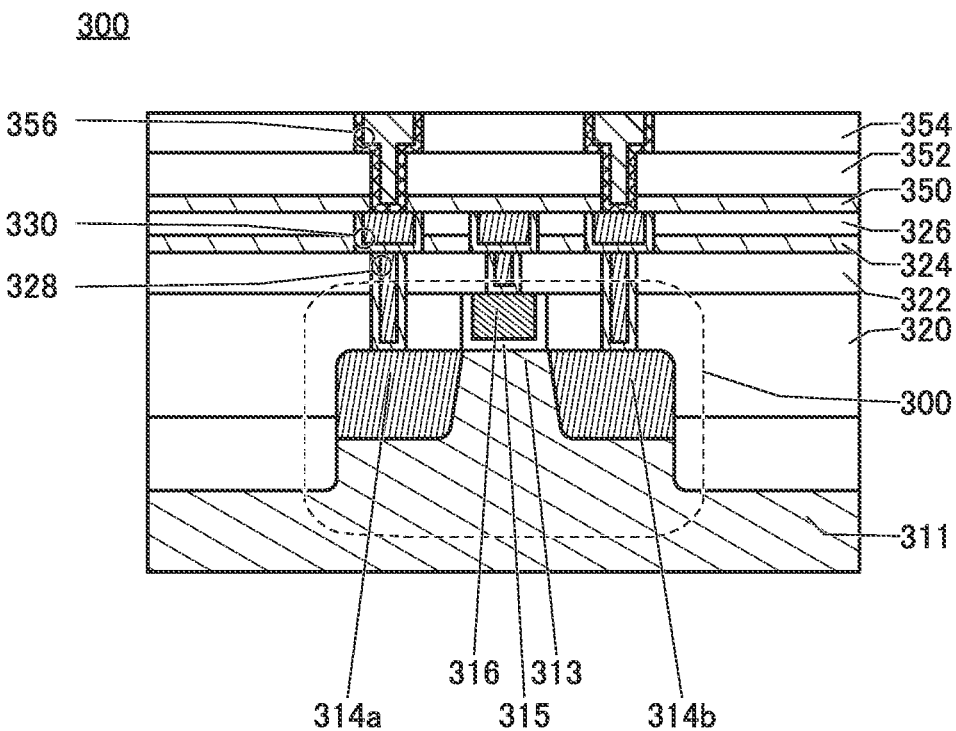

Here, in the transistor 300 illustrated in FIG. 14B, the semiconductor region 313 (part of the semiconductor substrate 311) in which a channel is formed has a convex shape. Furthermore, the conductor 316 is provided to cover the top and side surfaces of the semiconductor region 313 with the insulator 315 therebetween (not shown). Note that the conductor 316 may be formed using a material for adjusting the work function. The transistor 300 having such a structure is also referred to as a FIN transistor because the projecting portion of the semiconductor substrate 311 is utilized. An insulator functioning as a mask for forming the projecting portion may be provided in contact with the top surface of the projecting portion. Although the case where the projecting portion is formed by processing part of the semiconductor substrate 311 is described here, a semiconductor film having a projecting shape may be formed by processing an SOI substrate.

Note that the transistor 300 illustrated in FIG. 14B is an example and the structure is not limited thereto; an appropriate transistor may be used in accordance with a circuit configuration or a driving method.

<Memory Device 420>

Figure 15A:
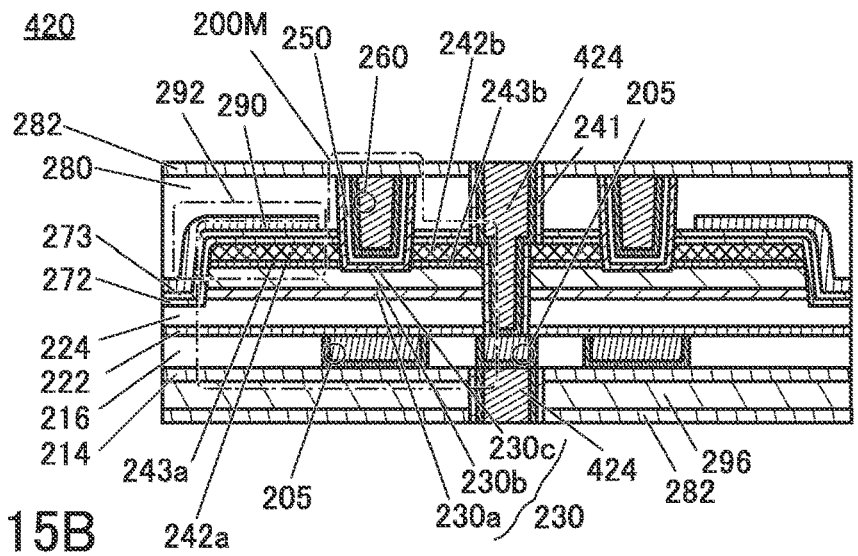
FIG. 15A to FIG. 15C are schematic cross-sectional views each illustrating a structure example of a memory device.

Next, the memory device 420 illustrated in FIG. 13 will be described with reference to FIG. 15A. Note that as for the description of the transistor 200M included in the memory device 420, the same description as that for the transistor 200 is omitted here.

In the memory device 420, the conductor 242a of the transistor 200M functions as one of electrodes of the capacitor 292, and the insulator 272 and the insulator 273 function as a dielectric. A conductor 290 is provided to overlap with the conductor 242a with the insulator 272 and the insulator 273 positioned therebetween and functions as the other electrode of the capacitor 292. The conductor 290 may be used as the other electrode of the capacitor 292 in the adjacent memory device 420. Alternatively, the conductor 290 may be electrically connected to the conductor 290 included in the adjacent memory device 420.

The conductor 290 is provided not only over the top surface of the conductor 242a but also on the side surface side of the conductor 242a so that the insulator 272 and the insulator 273 are positioned therebetween. This structure is preferable because the capacitor 292 can obtain capacitance higher than that obtained depending on an area where the conductor 242a and the conductor 290 overlap with each other.

The conductor 424 is electrically connected to the conductor 242b and is also electrically connected to another conductor 424 positioned in a lower layer with the conductor 205 positioned therebetween.

As a dielectric of the capacitor 292, silicon nitride, silicon nitride oxide, aluminum oxide, hafnium oxide, or the like can be used. Alternatively, a stack of these materials can be used. In the case where a dielectric of the capacitor 292 has a stacked-layer structure, a stack of aluminum oxide and silicon nitride or a stack of hafnium oxide and silicon oxide can be used. The stacking order is not limited. For example, silicon nitride may be stacked over aluminum oxide, or aluminum oxide may be stacked over silicon nitride.

Alternatively, as a dielectric of the capacitor 292, zirconium oxide having a higher dielectric constant than the above material may be used. As a dielectric of the capacitor 292, zirconium oxide may be used as a single layer or part of a stacked layer. For example, a stacked layer of zirconium oxide and aluminum oxide can be used. The capacitor 292 may have a stacked layer including three layers, in which zirconium oxide is used for the first layer and the third layer, and aluminum oxide is used for the second layer between the first layer and the third layer.

When zirconium oxide having a high dielectric constant is used as a dielectric of the capacitor 292, the area occupied by the capacitor 292 in the memory device 420 can be reduced. Thus, the area necessary for the memory device 420 can be reduced, which is preferable because the bit cost can be improved.

For the conductor 290, a material that can be used for the conductor 205, the conductor 242, the conductor 260, the conductor 424, or the like can be used.

In this embodiment, an example in which the transistors 200M and the capacitors 292 are arranged symmetrically with the conductor 424 positioned therebetween is shown. When a pair of the transistors 200M and a pair of the capacitors 292 are arranged in this manner, the number of conductors 424 electrically connected to the transistor 200M can be reduced. Thus, the area necessary for the memory device 420 can be downsized, which is preferable because the bit cost can be improved.

In the case where the insulator 241 is provided on the side surface of the conductor 424, the conductor 424 is connected to at least part of a top surface of the conductor 242b.

With use of the conductor 424 and the conductor 205, the transistor 200T and the memory device 420 in the memory unit 470 can be electrically connected to each other.

<Modification Example 1 of Memory Device 420>

Figure 15B:
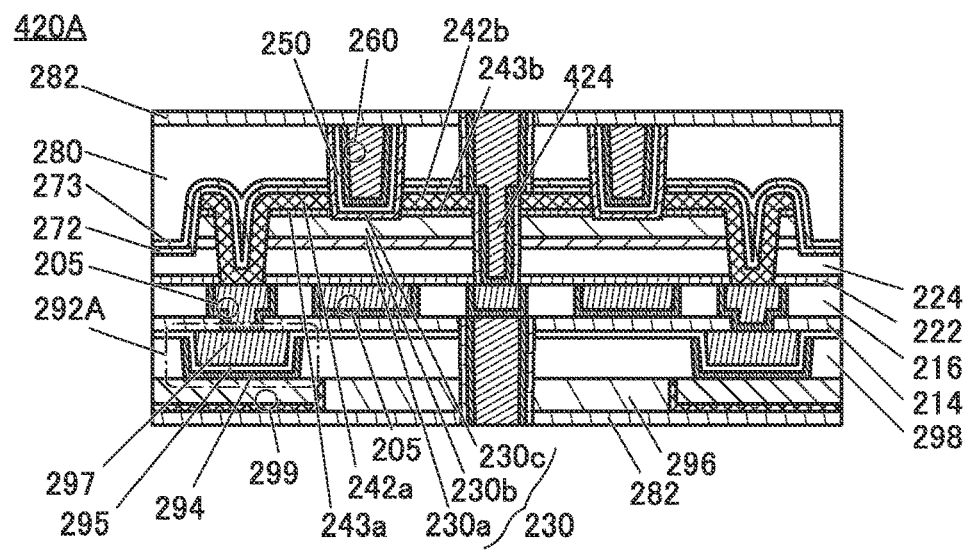

Next, as a modification example of the memory device 420, a memory device 420A will be described with reference to FIG. 15B. The memory device 420A includes the transistor 200M and a capacitor 292A electrically connected to the transistor 200M. The capacitor 292A is provided below the transistor 200M.

In the memory device 420A, the conductor 242a is positioned in an opening provided in the oxide 243a, the oxide 230b, the oxide 230a, the insulator 224, and the insulator 222 and is electrically connected to the conductor 205 at a bottom surface of the opening. The conductor 205 is electrically connected to the capacitor 292A.

The capacitor 292A includes a conductor 294 functioning as one of electrodes, an insulator 295 functioning as a dielectric, and a conductor 297 functioning as the other electrode. The conductor 297 overlaps with the conductor 294 with the insulator 295 positioned therebetween. The conductor 297 is electrically connected to the conductor 205.

The conductor 294 is provided on a bottom surface and a side surface of an opening formed in an insulator 298 over the insulator 296, and the insulator 295 is provided to cover the insulator 298 and the conductor 294. The conductor 297 is provided to be embedded in a depression portion in the insulator 295.

In addition, a conductor 299 is provided to be embedded in the insulator 296, and the conductor 299 is electrically connected to the conductor 294. The conductor 299 may be electrically connected to the conductor 294 in the adjacent memory device 420A.

The conductor 297 is provided not only over a top surface of the conductor 294 but also on a side surface side of the conductor 294 so that the insulator 295 is positioned therebetween. This structure is preferable because the capacitor 292A can obtain capacitance higher than that obtained depending on an area where conductor 294 and the conductor 297 overlap with each other.

As the insulator 295 functioning as a dielectric of the capacitor 292A, silicon nitride, silicon nitride oxide, aluminum oxide, hafnium oxide, or the like can be used. Alternatively, a stack of these materials can be used. In the case where the insulator 295 has a stacked-layer structure, a stack of aluminum oxide and silicon nitride, or a stack of hafnium oxide and silicon oxide can be used. The stacking order is not limited. For example, silicon nitride may be stacked over aluminum oxide, or aluminum oxide may be stacked over silicon nitride.

Alternatively, as the insulator 295, zirconium oxide having a higher dielectric constant than the above material may be used. As the insulator 295, zirconium oxide may be used as a single layer or part of a stacked layer. For example, a stacked layer of zirconium oxide and aluminum oxide can be used. The insulator 295 may have a stacked layer including three layers, in which zirconium oxide is used for the first layer and the third layer, and aluminum oxide is used for the second layer between the first layer and the third layer.

When zirconium oxide having a high dielectric constant is used as the insulator 295, the area occupied by the capacitor 292A in the memory device 420A can be reduced. Thus, the area necessary for the memory device 420A can be downsized, which is preferable because the bit cost can be improved.

For the conductor 297, the conductor 294, and the conductor 299, a material that can be used for the conductor 205, the conductor 242, the conductor 260, the conductor 424, and the like can be used.

For the insulator 298, a material that can be used for the insulator 214, the insulator 216, the insulator 224, the insulator 280, and the like can be used.

<Modification Example 2 of Memory Device 420>

Figure 15C:
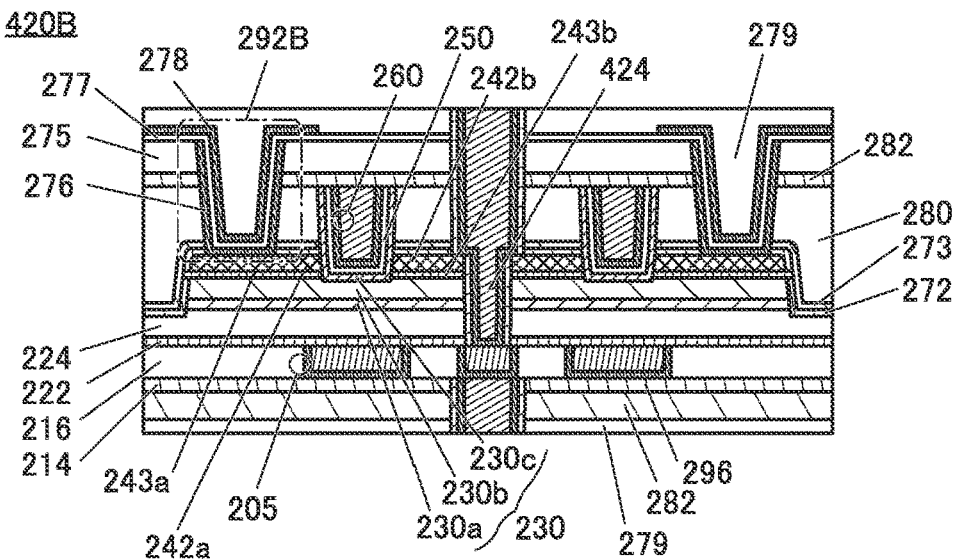

Next, as a modification example of the memory device 420, a memory device 420B will be described with reference to FIG. 15C. The memory device 420B includes the transistor 200M and a capacitor 292B that is electrically connected to the transistor 200M. The capacitor 292B is provided above the transistor 200M.

The capacitor 292B includes a conductor 276 functioning as one of electrodes, an insulator 277 functioning as a dielectric, and a conductor 278 functioning as the other electrode. The conductor 278 overlaps with the conductor 276 with the insulator 277 positioned therebetween.

An insulator 275 is provided over the insulator 282, and the conductor 276 is provided on a bottom surface and a side surface of an opening formed in the insulator 275, the insulator 282, the insulator 280, the insulator 273, and the insulator 272. The insulator 277 is provided to cover the insulator 282 and the conductor 276. The conductor 278 is provided to overlap with the conductor 276 in a depression portion in the insulator 277, and at least part thereof is provided over the insulator 275 with the insulator 277 positioned therebetween. The conductor 278 may be used as the other electrode of the capacitor 292B included in the adjacent memory device 420B. Alternatively, the conductor 278 may be electrically connected to the conductor 278 included in the adjacent memory device 420B.

The conductor 278 is provided not only over a top surface of the conductor 276 but also on a side surface side of the conductor 276 so that the insulator 277 is positioned therebetween. This structure is preferable because the capacitor 292B can obtain capacitance higher than that obtained depending on an area where the conductor 276 and the conductor 278 overlap with each other.

In addition, an insulator 279 may be provided to embed a depression portion in the conductor 278.

As the insulator 277 functioning as a dielectric of the capacitor 292B, silicon nitride, silicon nitride oxide, aluminum oxide, hafnium oxide, or the like can be used. Alternatively, a stack of these materials can be used. In the case where the insulator 277 has a stacked-layer structure, a stack of aluminum oxide and silicon nitride or a stack of hafnium oxide and silicon oxide can be used. The stacking order is not limited. For example, silicon nitride may be stacked over aluminum oxide, or aluminum oxide may be stacked over silicon nitride.

Alternatively, as the insulator 277, zirconium oxide having a higher dielectric constant than the above material may be used. As the insulator 277, zirconium oxide may be used as a single layer or part of a stacked layer. For example, a stacked layer of zirconium oxide and aluminum oxide can be used. Alternatively, the insulator 277 may have a stacked layer including three layers, in which zirconium oxide is used for the first layer and the third layer, and aluminum oxide is used for the second layer between the first layer and the third layer.

When zirconium oxide having a high dielectric constant is used for the insulator 277, the area occupied by the capacitor 292B in the memory device 420B can be reduced. Thus, the area necessary for the memory device 420B can be reduced, which is preferable because the bit cost can be improved.

For the conductor 276 and the conductor 278, a material that can be used for the conductor 205, the conductor 242, the conductor 260, the conductor 424, or the like can be used.

For the insulator 275 and the insulator 279, a material that can be used for the insulator 214, the insulator 216, the insulator 224, the insulator 280, and the like can be used.

<Connection of Memory Device 420 and Transistor 200T>

In a region 422 surrounded by a dashed-dotted line in FIG. 13, the memory device 420 is electrically connected to a gate of the transistor 200T via the conductor 424 and the conductor 205; however, this embodiment is not limited thereto.

Figure 16:
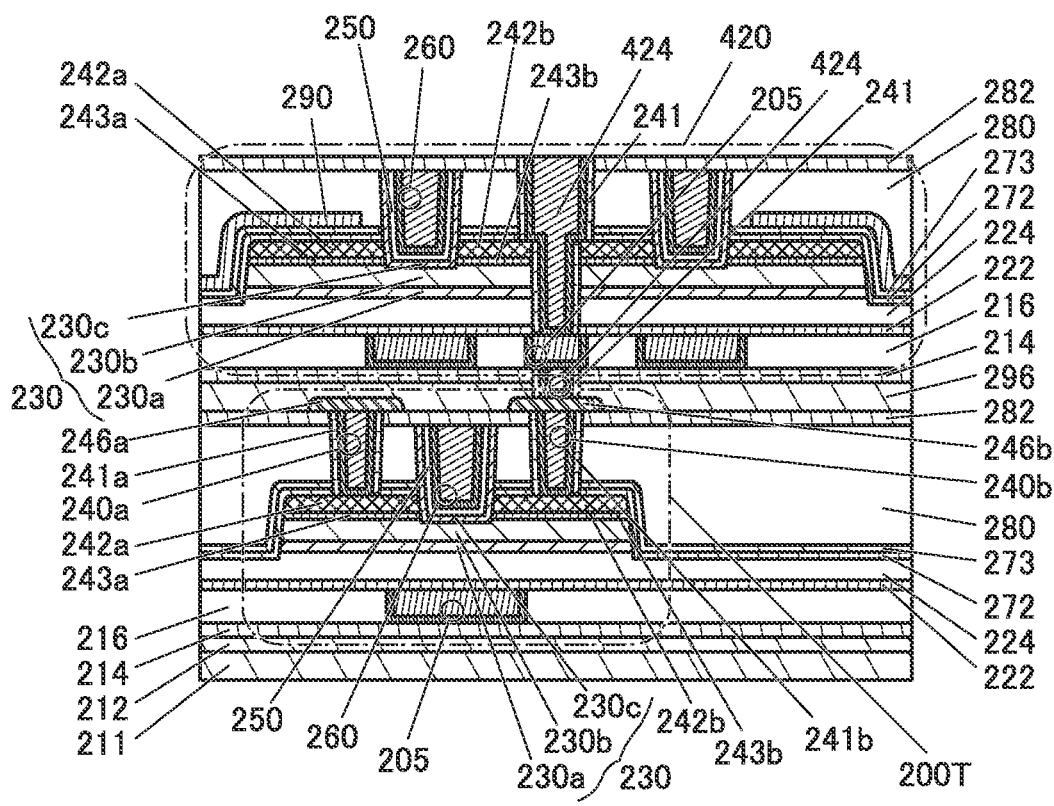
FIG. 16 is a schematic cross-sectional view illustrating a structure example of a memory device.

FIG. 16 shows an example in which the memory device 420 is electrically connected to the conductor 242b functioning as one of a source and a drain of the transistor 200T via the conductor 424, the conductor 205, the conductor 246b, and the conductor 240b.

As described above, a method for connecting the memory device 420 and the transistor 200T can be determined depending on the function of a circuit included in the transistor layer 413.

Figure 17:
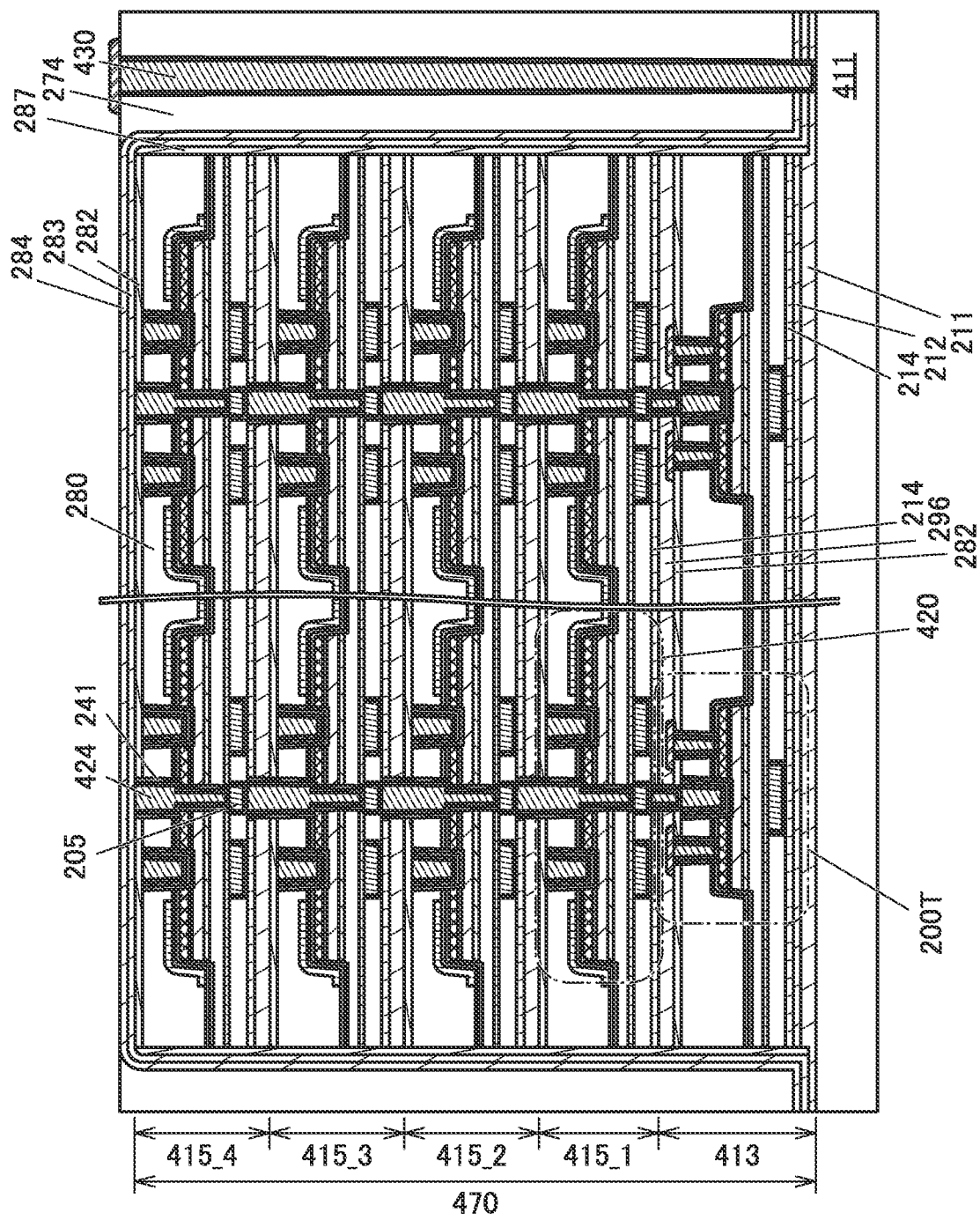
FIG. 17 is a schematic cross-sectional view illustrating a structure example of a memory device.

FIG. 17 shows an example in which the memory unit 470 includes the transistor layer 413 including the transistor 200T and four memory devices layer 415 (the memory device layer 415_1 to the memory device layer 415_4).

Each of the memory device layer 415_1 to the memory device layer 415_4 includes a plurality of the memory devices 420.

The memory device 420 is electrically connected to the memory device 420 included in another memory device layer 415 and the transistor 200T included in the transistor layer 413, via the conductor 424 and the conductor 205.

The memory unit 470 is sealed with the insulator 211, the insulator 212, the insulator 214, the insulator 287, the insulator 282, the insulator 283, and the insulator 284. The insulator 274 is provided around the insulator 284. The conductor 430 is provided in the insulator 274, the insulator 284, the insulator 283, and the insulator 211 and be electrically connected to the element layer 411.

The insulator 280 is provided in the sealing structure. The insulator 280 has a function of releasing oxygen by heating. The insulator 280 includes an excess oxygen region.

For the insulator 211, the insulator 283, and the insulator 284, a material having a high blocking property against hydrogen is preferably used. Furthermore, the insulator 214, the insulator 282, and the insulator 287 are preferably formed using a material having a function of trapping or fixing hydrogen.

Examples of the material having a high blocking property against hydrogen include silicon nitride and silicon nitride oxide. Examples of the material having a function of trapping or fixing hydrogen include aluminum oxide, hafnium oxide, and an oxide containing aluminum and hafnium (hafnium aluminate).

Note that in this specification and the like, a barrier property means a function of inhibiting diffusion of a targeted substance (or low permeability). Alternatively, a barrier property means a function of trapping and fixing (or gettering) a targeted substance.

Materials for the insulator 211, the insulator 212, the insulator 214, the insulator 287, the insulator 282, the insulator 283, and the insulator 284 may have an amorphous or crystal structure, although the crystallinity of the materials is not limited thereto. For example, an amorphous aluminum oxide film is suitably used for the material having a function of trapping or fixing hydrogen. Amorphous aluminum oxide may trap or fix hydrogen more than aluminum oxide with high crystallinity.

The following model can be given for excess oxygen in the insulator 280 with respect to hydrogen diffusion in an oxide semiconductor in contact with the insulator 280.

Hydrogen in the oxide semiconductor diffuses into another structure body through the insulator 280 in contact with the oxide semiconductor. As the hydrogen diffusion, the hydrogen in the oxide semiconductor reacts with the excess oxygen in the insulator 280 to be OH bonding and diffuses in the insulator 280. The hydrogen atom having the OH bonding reacts with the oxygen atom bonded to an atom (such as a metal atom) in the insulator 282 in reaching a material which has a function of trapping or fixing hydrogen (typically the insulator 282), and is trapped or fixed in the insulator 282. The oxygen atom which had the OH bonding of the excess oxygen may remain as an excess oxygen in the insulator 280. That is, the excess oxygen in the insulator 280 highly probably acts as a bridge in the hydrogen diffusion.

A manufacturing process of the memory device is one of important factors for the model.

For example, the insulator 280 containing excess oxygen is formed above the oxide semiconductor, and then the insulator 282 is formed. After that heat treatment is preferably performed. The heat treatment is performed at a temperature higher than or equal to 350° C., preferably higher than or equal to 400° C. in an atmosphere containing oxygen, an atmosphere containing nitrogen, or an atmosphere of a mixture of oxygen and nitrogen. The heat treatment is performed for one hour or more, preferably four hours or more, further preferably eight hours or more.

The heat treatment enables diffusion of hydrogen from the oxide semiconductor to the outside through the insulator 280, the insulator 282, and the insulator 287. This reduces the absolute amount of hydrogen in and near the oxide semiconductor.

The insulator 283 and the insulator 284 are formed after the heat treatment. The insulator 283 and the insulator 284 have a high blocking property against hydrogen and accordingly can inhibit the entry of hydrogen outside or the hydrogen which has been diffused to the outside into the inside, specifically, the oxide semiconductor or insulator 280 side.

The heat treatment is performed after the insulator 282 is formed in the above example; however, one embodiment of the present invention is not limited thereto. For example the heat treatment may be performed after the transistor element layer 413 is formed or after the memory device layer 415_1 to the memory device layer 415_4 are formed. When hydrogen diffuses outward by the heat treatment, hydrogen diffuses in the upward direction or in the lateral direction of the transistor layer 413. When the heat treatment is performed after the memory device layer 415_1 to the memory device layer 415_4 are formed, hydrogen similarly diffuses in the upward direction or in the lateral direction.

The above manufacturing process yields the sealing structure by bonding the insulator 211 and the insulator 283.

The above-described structure and manufacturing process enable a memory device using an oxide semiconductor with reduced hydrogen concentration. Thus, a highly reliable memory device can be provided. One embodiment of the present invention can provide a memory device with favorable electrical characteristics.

FIG. 18A to FIG. 18C show an example of a different arrangement of the conductor 424. FIG. 18A is a layout diagram of the memory device 420 seen from the top, FIG. 18B is a cross-sectional view of a portion taken along dashed-dotted line A1-A2 in FIG. 18A, and FIG. 18C is a cross-sectional view of a portion taken along dashed-dotted line B1-B2 in FIG. 18A. Note that in FIG. 18A, the conductor 205 is not illustrated for easy understanding. In the case where the conductor 205 is provided, the conductor 205 has a region overlapping with the conductor 424.

As illustrated in FIG. 18A, the conductor 424 is provided not only in the region overlapping with the oxide 230a and the oxide 230b but also outside the oxide 230a and the oxide 230b. Although in the example shown in FIG. 18A, the conductor 424 is provided to protrude from the oxide 230a and the oxide 230b on B2 side, this embodiment is not limited thereto. The conductor 424 may be provided to protrude from the oxide 230a and the oxide 230b on B1 side or may be provided to protrude from both B1 and B2 sides.

FIG. 18B and FIG. 18C show an example in which the memory device layer 415_p (p is a natural number greater than or equal to 2 and less than or equal to n) is stacked over the memory device layer 415_p-1. The memory device 420 included in the memory device layer 415_p-1 is electrically connected to the memory device 420 included in the memory device layer 415_p via the conductor 424 and the conductor 205.

FIG. 18B shows a state where the conductor 424 in the memory device layer 415_p-1 is connected to the conductor 242 in the memory device layer 415_p-1 and the conductor 205 in the memory device layer 415_p. Here, the conductor 424 is also connected to the conductor 205 in the memory device layer 415_p-1 on an outer side that is on B2 side of the conductor 242, the oxide 243, the oxide 230b, and the oxide 230a.

According to FIG. 18C, the conductor 424 is formed along side surfaces of the conductor 242, the oxide 243, the oxide 230b, and the oxide 230a on B2 side, and is electrically connected to the conductor 205 through an opening formed in the insulator 280, the insulator 273, the insulator 272, the insulator 224, and the insulator 222. In FIG. 18B, the state where the conductor 424 is provided along the side surfaces of the conductor 242, the oxide 243, the oxide 230b, and the oxide 230a on B2 side is shown by a dotted line. Moreover, the insulator 241 is formed, in some cases, between the conductor 424 and the side surfaces of the conductor 242, the oxide 243, the oxide 230b, the oxide 230a, the insulator 224, and the insulator 222 on B2 side.

The conductor 424 is provided also in a region not overlapping with the conductor 242 or the like, whereby the memory device 420 can be electrically connected to another memory device 420 provided in a different memory device layer 415. In addition, the memory device 420 can be electrically connected to the transistor 200T provided in the transistor layer 413.

When the conductor 424 serves as a bit line, the conductor 424 is provided in a region not overlapping with the conductor 242 or the like, so that the length of the bit line between the memory devices 420 adjacent to each other in B1-B2 direction can be increased. As illustrated in FIG. 18, the distance between the conductors 424 over the conductor 242 is d1, and the distance between the conductors 424 positioned below the oxide 230a, that is, in the opening formed in the insulator 224 and the insulator 222 is d2; d2 is larger than d1. Whereas the distance between the conductors 424 adjacent to each other in B1-B2 direction is d1, part of the distance is set to d2, so that the parasitic capacitance of the conductor 424 can be reduced. A reduction in parasitic capacitance of the conductor 424 is preferable because the capacitance necessary for the capacitor 292 can be reduced.

Note that this embodiment can be implemented in combination with the other embodiments described in this specification as appropriate.

Embodiment 4

In this embodiment, the compositions of a CAC-OS (Cloud-Aligned Composite oxide semiconductor) and a CAAC-OS (c-axis aligned crystalline oxide semiconductor) which are metal oxides that can be used in the OS transistor described in the above embodiment will be described.
<Composition of Metal Oxide>

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in a channel formation region of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.
<Structure of Metal Oxide>

Oxide semiconductors can be classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

Oxide semiconductors might be classified in a manner different from the above-described one when classified in terms of the crystal structure. The classification of the crystal structures of oxide semiconductor will be explained with FIG. 19A. FIG. 19A is a diagram showing the classification of crystal structures of an oxide semiconductor, typically IGZO (a metal oxide containing In, Ga, and Zn).

As shown in FIG. 19A, IGZO is roughly classified into Amorphous, Crystalline, and Crystal. Amorphous includes completely amorphous structure. Crystalline includes CAAC (c-axis-aligned crystalline), nc (nanocrystalline), and CAC (Cloud-Aligned Composite). Crystal includes single crystal and poly crystal.

Note that the structure shown in the thick frame in FIG. 19A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into Crystalline (also referred to as crystalline IGZO), are shown in FIG. 19B and FIG. 19C. FIG. 19B shows an XRD spectrum of quartz glass and FIG. 19C shows an XRD spectrum of crystalline IGZO. Note that the crystalline IGZO shown in FIG. 19C has a composition of In:Ga:Zn=4:

2:3 [atomic ratio]. Furthermore, the crystalline IGZO shown in FIG. 19C has a thickness of 500 nm.

As indicated by arrows in FIG. 19B, the XRD spectrum of the quartz glass shows a substantially symmetrical peak. In contrast, as indicated by arrows in FIG. 19C, the XRD spectrum of the crystalline IGZO shows an asymmetrical peak. The asymmetrical peak of the XRD spectrum clearly shows the existence of crystal. In other words, the structure cannot be regarded as Amorphous unless it has a bilaterally symmetrical peak in the XRD spectrum.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) cannot be observed even in the vicinity of distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond length changed by substitution of a metal element, and the like. A crystal structure in which a clear grain boundary is observed is what is called a polycrystal structure. It is highly probable that the grain boundary becomes a recombination center and traps carriers and thus decreases the on-state current or field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is an oxide semiconductor with high crystallinity. Meanwhile, in the CAAC-OS, a reduction in electron mobility due to a crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS.

An oxide semiconductor has various structures with different properties. An oxide semiconductor of one embodiment of the present invention may include two or more of an amorphous oxide semiconductor, a polycrystalline oxide semiconductor, the a-like OS, the nc-OS, and the CAAC-OS.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier density is preferably used for the transistor. To reduce the carrier density of an oxide semiconductor film, the impurity concentration in the oxide semiconductor film is lowered so that the density of defect states can be reduced. In this specification and the like, a state with a low impurity concentration and a low density of defect states is referred to as a highly purified intrinsic or substantially highly purified intrinsic state.

Moreover, a highly purified intrinsic or substantially highly purified intrinsic oxide semiconductor film has a low density of defect states and accordingly may have a low density of trap states.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the concentration in an oxide semiconductor is effective. In order to reduce the impurity concentration in the oxide semiconductor, it is preferable that the impurity concentration in an adjacent film be also reduced. Examples of impurities include hydrogen, nitrogen, alkali metal, alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Therefore, it is preferable to reduce the concentration of an alkali metal or an alkaline earth metal in the oxide semiconductor. Specifically, the concentration of an alkali metal or an alkaline earth metal in the oxide semiconductor obtained by SIMS is lower than or equal to $1\times10^{18}$ atoms/cm$^3$, preferably lower than or equal to $2\times10^{16}$ atoms/cm$^3$.

When containing nitrogen, the oxide semiconductor easily becomes n-type by generation of electrons serving as carriers and an increase in carrier density. As a result, a transistor using an oxide semiconductor containing nitrogen for its channel formation region is likely to have normally-on characteristics. For this reason, nitrogen in the oxide semiconductor is preferably reduced as much as possible. For example, the nitrogen concentration in the oxide semiconductor is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

Note that this embodiment can be implemented in combination with the other embodiments described in this specification as appropriate.

Embodiment 5

In this embodiment, examples of electronic components and electronic devices in which the memory device or the like described in the above embodiment is incorporated will be described.

<Electronic Component>

First, examples of electronic components in which the memory device 10A and the like is incorporated will be described with reference to FIG. 20A and FIG. 20B.

Figure 20A:
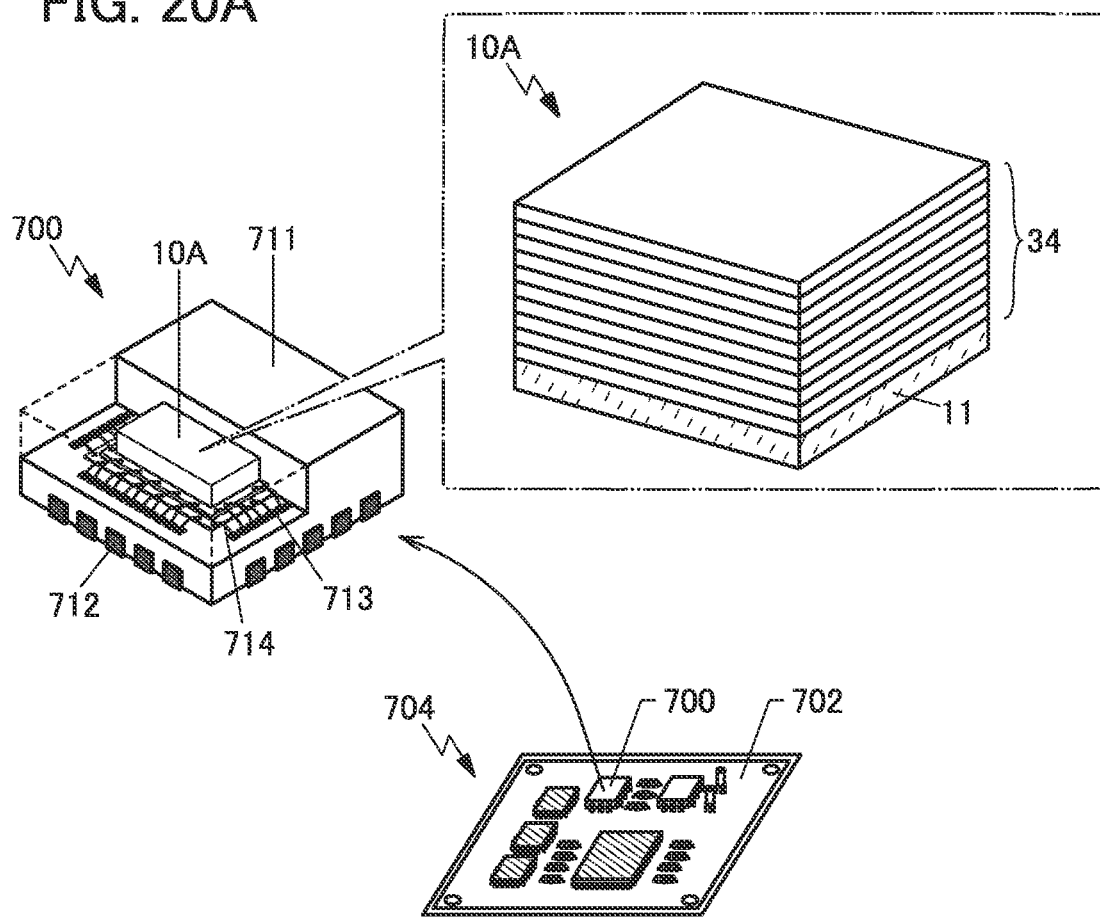
FIG. 20A and FIG. 20B are schematic diagrams illustrating examples of electronic components.

FIG. 20A is a perspective view of an electronic component 700 and a substrate (a mounting board 704) on which the electronic component 700 is mounted. In the electronic component 700 illustrated in FIG. 20A, the memory device 10A where the element layers 34 are stacked over the semiconductor substrate 11 is included in a mold 711. FIG. 20A omits part of the electronic component 700 to show the inside of the electronic component 700. The electronic component 700 includes a land 712 outside the mold 711. The land 712 is electrically connected to an electrode pad 713, and the electrode pad 713 is electrically connected to the memory device 10A via a wire 714. The electronic component 700 is mounted on a printed circuit board 702, for example. A plurality of such electronic components are combined and electrically connected to each other on the printed circuit board 702, whereby the mounting board 704 is completed.

Figure 20B:
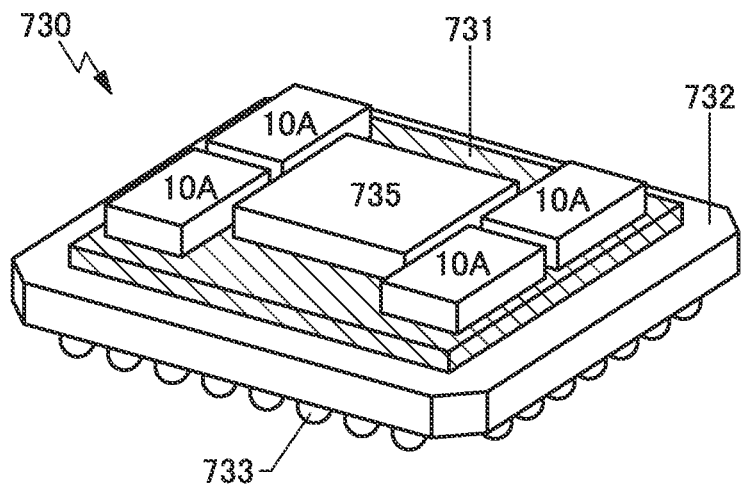

FIG. 20B is a perspective view of an electronic component 730. The electronic component 730 is an example of a SiP (System in Package) or an MCM (Multi Chip Module). In the electronic component 730, an interposer 731 is provided on a package substrate 732 (a printed circuit board), and a semiconductor device 735 and a plurality of memory devices 10A are provided on the interposer 731.

The electronic component 730 using the memory devices 10A as high bandwidth memory (HBM) is shown as an example. An integrated circuit (semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is sometimes referred to as a "redistribution substrate" or an "intermediate substrate". A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is implanted.

In a SiP, an MCM, or the like using a silicon interposer, the decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on an interposer.

A heat sink (a radiator plate) may be provided to overlap the electronic component 730. In the case of providing a heat sink, the heights of integrated circuits provided on the interposer 731 are preferably equal to each other. For example, in the electronic component 730 described in this embodiment, the heights of the memory device 10A and the semiconductor device 735 are preferably equal to each other.

To implant the electronic component 730 on another substrate, an electrode 733 may be provided on the bottom portion of the package substrate 732. FIG. 20B illustrates an example in which the electrode 733 is formed of a solder ball. When solder balls are provided in a matrix on the bottom portion of the package substrate 732, BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

<Electronic Device>

Figure 21:
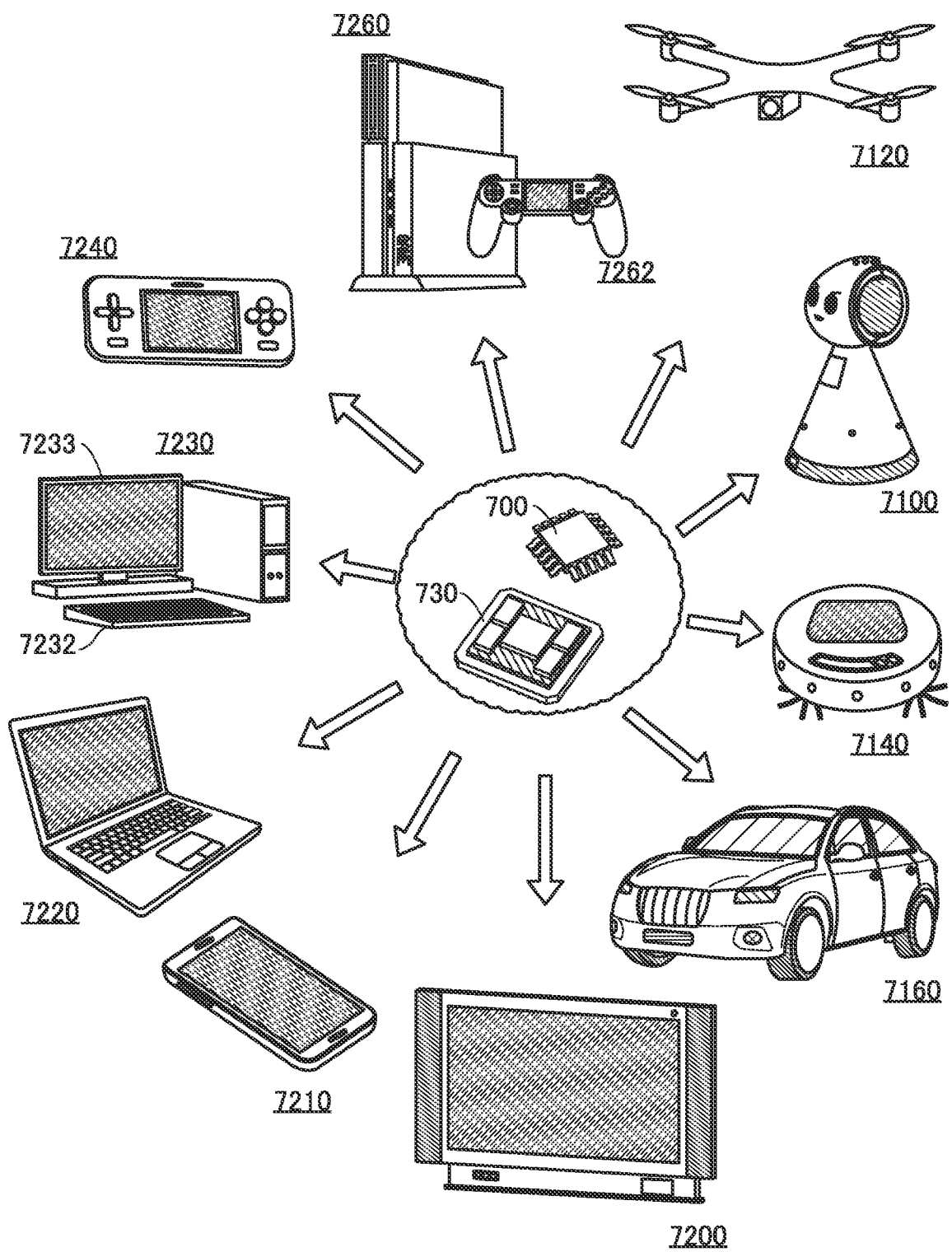
FIG. 21 is a diagram illustrating examples of electronic devices.

Next, examples of electronic devices including the above electronic component will be described with reference to FIG. 21.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with use of the microphone and the speaker.

The camera has a function of taking images of the surroundings of the robot 7100. The robot 7100 has a function of moving with use of the moving mechanism. The robot 7100 can take images of the surroundings with use of the camera and analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 can run autonomously, detect dust, and vacuum the dust through the inlet provided on the bottom surface.

For example, the electronic component 730 can analyze images taken by the cameras to judge whether there is an obstacle such as a wall, furniture, or a step. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, PCs (personal computers) 7220 and 7230, a game machine 7240, a game machine 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a laptop PC and a desktop PC. To the PC 7230, a keyboard 7232 and a monitor device 7233 can be connected with or without a wire. The game machine 7240 is an example of a portable game machine. The game machine 7260 is an example of a stationary game machine. To the game machine 7260, a controller 7262 is connected with or without a wire. The electronic component 700 and/or the electronic component 730 can be incorporated in the controller 7262.

<Various Kinds of Memory Device>

Figure 22:
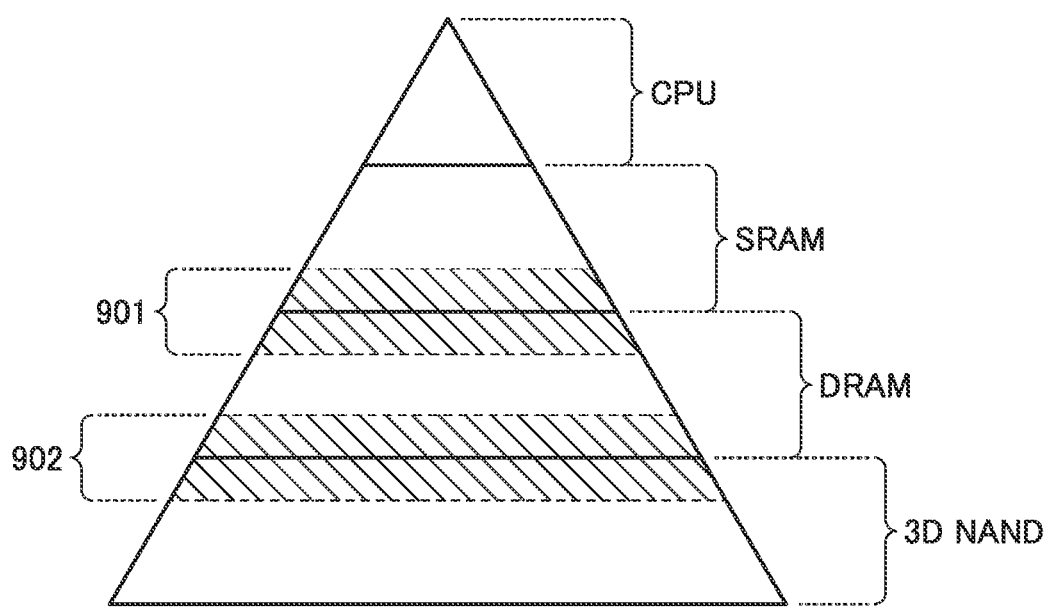
FIG. 22 is a diagram illustrating a hierarchy of various kinds of memory devices.

In general, a variety of memory devices (memory) are used as semiconductor devices such as a computer in accordance with the intended use. FIG. 22 is a hierarchy diagram showing various memory devices with different levels. The memory devices at the upper levels of the diagram require high access speeds, and the memory devices at the lower levels require large memory capacity and high record density. In FIG. 22, sequentially from the top level, a memory combined as a register in an arithmetic processing device such as a CPU, a static random access memory (SRAM), a dynamic random access memory (DRAM), and a 3D NAND memory are shown.

A memory included as a register in an arithmetic processing device such as a CPU is used for temporary storage of arithmetic operation results, for example, and thus is very frequently accessed by the arithmetic processing device. Accordingly, rapid operation is more important than the memory capacity of the memory. The register also has a function of retaining settings of the arithmetic processing device, for example.

An SRAM is used for a cache, for example. The cache has a function of holding a copy of part of data held in a main memory. Copying data which is frequently used and holding the copy of the data in the cache facilitates rapid data access.

A DRAM is used for the main memory, for example. The main memory has a function of holding a program or data which are read from the storage space. The record density of a DRAM is approximately 0.1 to 0.3 $Gbit/mm^2$.

A 3D NAND memory is used for the storage, for example. The storage has a function of holding data that needs to be stored for a long time and programs used in an arithmetic processing device, for example. Therefore, the storage needs to have a high memory capacity and a high memory density rather than operating speed. The memory density for a storage space is approximately 0.6 to 6.0 Gbit/mm².

The memory device relating to one embodiment of the present invention operates fast and can hold data for a long time. The memory device relating to one embodiment of the present invention can be favorably used as a memory device in a boundary region 901 that includes both the level including the cache and the level including the main memory. The memory device relating to one embodiment of the present invention can be favorably used as a memory device in a boundary region 902 that includes both the level including the main memory and the level including the storage.

Note that this embodiment can be implemented in combination with the other embodiments described in this specification as appropriate.

REFERENCE NUMERALS

A0: bit, A3: bit, B0: check bit, BL_1: bit line, C1: input terminal, C2: input terminal, C3: input terminal, C4: input terminal, C5: input terminal, C8: input terminal, C61: capacitor, C71: capacitor, CK1: clock signal, CK4: clock signal, S_C1: control signal, S_C2: control signal, S_C3: control signal, S_C4: control signal, S_C5: control signal, S_C8: control signal, T_A0: input terminal, T_A3: input terminal, T_B0: input terminal, T_CK1: input terminal, T_CK4: input terminal, WL_N: word line, WL_1: word line, 10A: memory device, 10B: memory device, 10C: memory device, 11: semiconductor substrate, 20: peripheral circuit, 21: row driver, 22: column driver, 23: switch circuit, 23_A: switch, 23_C: switch, 24: precharge circuit, 24_1: transistor, 24_3: transistor, 25: sense amplifier, 25_1: transistor, 25_2: transistor, 25_3: transistor, 25_4: transistor, 26: element layer, 28_a: transistor, 28_b: transistor, 29: circuit, 30: memory cell array, 31_N: memory cell, 31_1: memory cell, 32_N: transistor, 32_1: transistor, 33_N: capacitor, 33_1: capacitor, 34: element layer, 34_N: element layer, 34_1: element layer, 34_5: element layer, 39: unit, 39_M: unit, 39_1: unit, 40A: sealing layer, 40B: sealing layer, 41: switch circuit, 51: NAND circuit, 51_1: NAND circuit, 51_4: NAND circuit, 52: delay circuit, 52_1: delay circuit, 52_2: delay circuit, 52_4: delay circuit, 53: XOR circuit, 53_1: XOR circuit, 53_3: XOR circuit, 53_4: XOR circuit, 53_7: XOR circuit, 54: check bit generation circuit, 55: error detection circuit, 61: transistor, 64: transistor, 71: transistor, 72: transistor, 200: transistor, 200M: transistor, 200T: transistor, 205: conductor, 205a: conductor, 205b: conductor, 211: insulator, 212: insulator, 214: insulator, 216: insulator, 222: insulator, 224: insulator, 230: oxide, 230a: oxide, 230b: oxide, 230c: oxide, 240: conductor, 240a: conductor, 240b: conductor, 241: insulator, 241a: insulator, 241b: insulator, 242: conductor, 242a: conductor, 242b: conductor, 243: oxide, 243a: oxide, 243b: oxide, 246: conductor, 246a: conductor, 246b: conductor, 250: insulator, 260: conductor, 260a: conductor, 260b: conductor, 272: insulator, 273: insulator, 274: insulator, 275: insulator, 276: conductor, 277: insulator, 278: conductor, 279: insulator, 280: insulator, 282: insulator, 283: insulator, 284: insulator, 287: insulator, 290: insulator, 292: capacitor, 292A: capacitor, 292B: capacitor, 294: conductor, 295: insulator, 296: insulator, 297: conductor, 298: insulator, 299: conductor, 300: transistor, 311: semiconductor substrate, 313: semiconductor region, 314a: low-resistance region, 314b: low-resistance region, 315: insulator, 316: conductor, 411: element layer, 413: transistor layer, 413_m: transistor layer, 413_1: transistor layer, 415: memory device layer, 415_n: memory device layer, 415_p: memory device layer, 415_p-1: memory device layer, 415_1: memory device layer, 415_4: memory device layer, 420: memory device, 420A: memory device, 420B: memory device, 422: region, 424: conductor, 426: conductor, 428: conductor, 430: conductor, 470: memory unit, 470_m: memory unit, 470_1: memory unit, 700: electronic component, 702: printed circuit board, 704: mounting board, 711: mold, 712: land, 713: electrode pad, 714: wire, 730: electronic component, 731: interposer, 732: package substrate, 733: electrode, 735: semiconductor device, 901: boundary region, 902: boundary region, 7100: robot, 7120: flying object, 7140: cleaning robot, 7160: automobile, 7200: TV device, 7210: smartphone, 7220: PC, 7230: PC, 7232: keyboard, 7233: monitor device, 7240: game machine, 7260: game machine, 7262: controller

The invention claimed is:

1. A memory device comprising:
a first element layer comprising a memory cell;
a second element layer comprising an error detection circuit;
a semiconductor substrate comprising a driver circuit; and
a sense amplifier and a precharge circuit,
wherein the second element layer is positioned between the semiconductor substrate and the first element layer,
wherein the memory cell comprises a first transistor,
wherein the error detection circuit comprises a second transistor,
wherein the driver circuit comprises a third transistor,
wherein the sense amplifier comprises a fourth transistor,
wherein the precharge circuit comprises a fifth transistor,
wherein the first transistor and the second transistor each comprise a metal oxide in a channel formation region,
wherein the third transistor comprises silicon in a channel formation region,
wherein the first transistor and the second transistor each comprise a front gate and a back gate,
wherein the second element layer further comprises a switch circuit,
wherein the switch circuit comprises a first switch,
wherein a bit line provided in a direction perpendicular to the semiconductor substrate is electrically connected to the fourth transistor and the fifth transistor via a sixth transistor, and
wherein an output signal of the error detection circuit is output to the driver circuit through the first switch of the switch circuit.

2. A memory device comprising:
a plurality of first element layers;
a second element layer comprising an error detection circuit;
a semiconductor substrate comprising a driver circuit; and
a sense amplifier and a precharge circuit,
wherein the second element layer is positioned between the semiconductor substrate and the plurality of first element layers,
wherein the plurality of first element layers each comprise a memory cell,
wherein the plurality of first element layers are stacked over each other,
wherein the memory cell comprises a first transistor,
wherein the error detection circuit comprises a second transistor, wherein the driver circuit comprises a third transistor,
wherein the sense amplifier comprises a fourth transistor,
wherein the precharge circuit comprises a fifth transistor,
wherein the first transistor and the second transistor each comprise a metal oxide in a channel formation region,
wherein the third transistor comprises silicon in a channel formation region,
wherein the first transistor and the second transistor each comprise a front gate and a back gate, and
wherein a bit line provided in a direction perpendicular to the semiconductor substrate is electrically connected to the fourth transistor and the fifth transistor via a sixth transistor.

3. A memory device comprising:
first to N-th first element layers;
a second element layer comprising a switch circuit; and
a semiconductor substrate,
wherein a K-th first element layer of the first to N-th first element layers comprises a memory cell using a first transistor formed in the K-th first element layer,
wherein the second element layer comprises an error detection circuit using a second transistor formed in the second element layer,
wherein the semiconductor substrate comprises a driver circuit using a third transistor formed in the semiconductor substrate,
wherein the second element layer is stacked over the semiconductor substrate,
wherein the K-th first element layer of the first to N-th first-element layers is stacked over the second element layer,
wherein the K-th first element layer of the first to N-th first element layers is stacked over the (K−1)-th first element layer,
wherein N is a natural number greater than or equal to 2,
wherein K is an integer greater than or equal to 2 and less than or equal to N,
wherein the first transistor and the second transistor each comprise a metal oxide in a channel formation region,
wherein the first transistor and the second transistor each comprise a front gate and a back gate,
wherein the third transistor comprises silicon in a channel formation region,
wherein the switch circuit comprises a first switch and a second switch,
wherein the first switch of the switch circuit is electrically connected to a bit line via a fourth transistor, and
wherein the second switch of the switch circuit is electrically connected to the error detection circuit.

* * * * *